(12) United States Patent
Lo

(10) Patent No.: US 11,652,157 B2
(45) Date of Patent: May 16, 2023

(54) SPACER STRUCTURE FOR SEMICONDUCTOR DEVICE

(71) Applicant: Taiwan Semiconductor Manufacturing Co., Ltd., Hsinchu (TW)

(72) Inventor: Yi-Chen Lo, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/706,339

(22) Filed: Mar. 28, 2022

(65) Prior Publication Data

US 2022/0223715 A1    Jul. 14, 2022

Related U.S. Application Data

(63) Continuation of application No. 16/990,865, filed on Aug. 11, 2020, now Pat. No. 11,289,586.

(51) Int. Cl.
*H01L 29/66* (2006.01)
*H01L 29/78* (2006.01)

(52) U.S. Cl.
CPC .... *H01L 29/6656* (2013.01); *H01L 29/66553* (2013.01); *H01L 29/66795* (2013.01); *H01L 29/7851* (2013.01); *H01L 2029/7858* (2013.01)

(58) Field of Classification Search
CPC ......... H01L 21/02603; H01L 21/28141; H01L 21/823431; H01L 21/823821; H01L 21/845; H01L 27/0886; H01L 27/0924; H01L 27/10879; H01L 27/1211; H01L 29/0653; H01L 29/0665; H01L 29/0669; H01L 29/0673; H01L 29/41791; H01L 29/66439; H01L 29/6653; H01L 29/66553; H01L 29/6656; H01L 29/66795; H01L 29/775; H01L 29/785; H01L 29/7851; H01L 29/7855; H01L 2029/7858
See application file for complete search history.

(56) References Cited

U.S. PATENT DOCUMENTS

| | | | |
|---|---|---|---|
| 10,263,100 B1* | 4/2019 | Bi | H01L 29/66439 |
| 2018/0315828 A1* | 11/2018 | Yamashita | H01L 29/66545 |
| 2019/0157444 A1* | 5/2019 | Yang | H01L 21/823431 |
| 2019/0198645 A1* | 6/2019 | Cheng | H01L 29/66742 |
| 2019/0280104 A1* | 9/2019 | Ma | H01L 29/66545 |
| 2020/0227570 A1* | 7/2020 | Chen | H01L 29/1079 |

* cited by examiner

*Primary Examiner* — David C Spalla
(74) *Attorney, Agent, or Firm* — Sterne, Kessler, Goldstein & Fox P.L.L.C.

(57) ABSTRACT

The present disclosure describes a semiconductor structure and a method for forming the same. The semiconductor structure can include a substrate, a fin structure over the substrate, a gate structure over the fin structure, a first inner spacer layer formed in the fin structure and adjacent to the gate structure, and a second inner spacer layer extending through the first inner spacer layer.

20 Claims, 23 Drawing Sheets

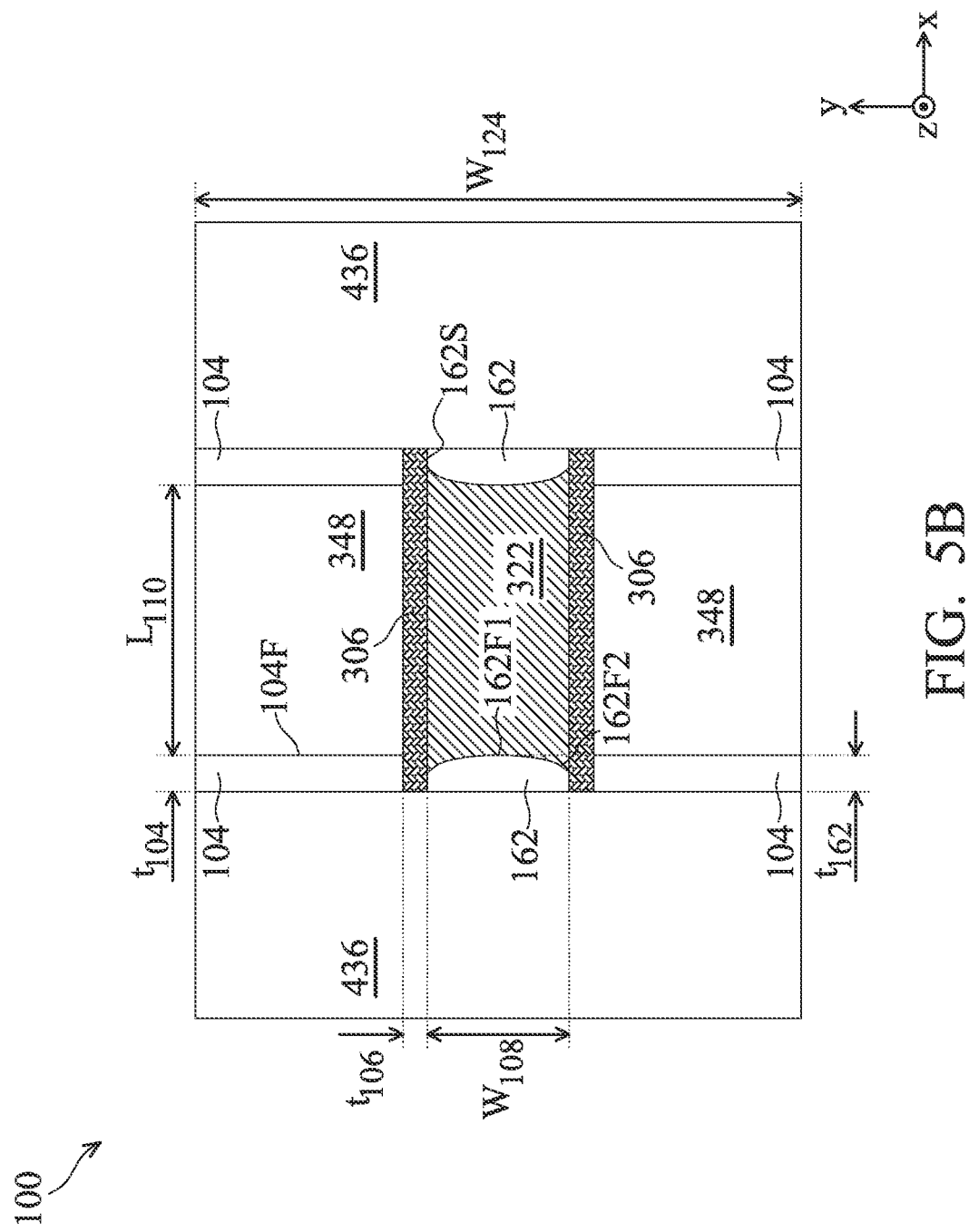

SPACER STRUCTURE FOR SEMICONDUCTOR DEVICE

CROSS-REFERENCE TO RELATED APPLICATION

This application is a continuation of U.S. Non-Provisional patent application Ser. No. 16/990,865, filed on Aug. 11, 2020, titled "Spacer Structure for Semiconductor Device," the disclosure of which is incorporated by reference herein in its entirety.

BACKGROUND

Advances in semiconductor technology has increased the demand for semiconductor devices with higher storage capacity, faster processing systems, higher performance, and lower costs. To meet these demands, the semiconductor industry continues to scale down the dimensions of semiconductor devices, such as nano-sheet FETs. Such scaling down has increased the complexity of semiconductor manufacturing processes.

BRIEF DESCRIPTION OF THE DRAWINGS

Aspects of this disclosure are best understood from the following detailed description when read with the accompanying figures.

FIGS. 4A-11A and 4B-11B are cross-sectional views of a semiconductor device at various stages of its fabrication process, according to some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
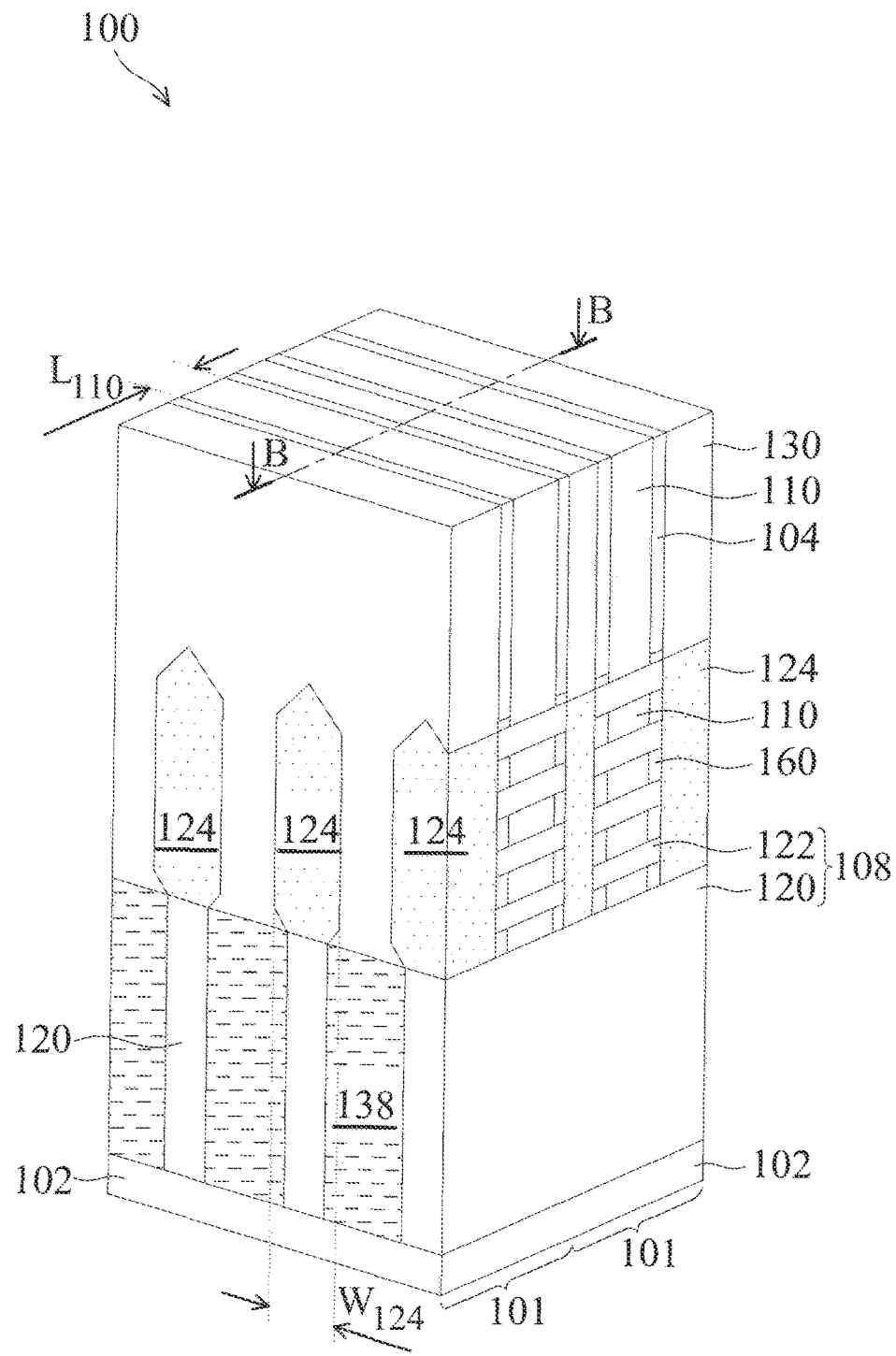
FIG. 1A is an isometric view of a semiconductor device, according to some embodiments.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

As used herein, the term "vertical" means nominally perpendicular to the surface of a substrate.

Fins associated with fin field effect transistors (finFETs) or gate-all-around (GAA) FETs can be patterned by any suitable method. For example, the fins can be patterned using one or more photolithography processes, including a double-patterning process or a multi-patterning process. Double-patterning and multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers can then be used to pattern the fins.

Technology advances in the semiconductor industry drive the pursuit of integrated circuits (ICs) having higher device density, higher performance, and lower cost. In the course of the IC evolution, nano-sheet transistors can replace planar field effect transistor (FET) and/or fin field-effect transistor (finFET) to achieve ICs with higher device densities. Nano-sheet transistors can use a gate-all-around (GAA) gate structure to surround each nano-sheet channel layer to effectively reconcile short channel effects. Nano-sheet transistors require an inner spacer to physically separate the nano-sheet transistor's source-drain (S/D) regions from the nano-sheet transistor's GAA gate structure. However, the inner spacer can be susceptible to structural damage during the fabrication process of defining nano-sheet channel layers. Such inner spacer's structural damage can cause the S/D region's structural damage, thus causing IC failure.

The present disclosure is directed to a fabrication method and a transistor with a multilayered inner spacer. The transistor can be a gate-all-around field effect transistor (GAA FET), and the multilayered inner spacer can be formed between the transistor's S/D region and the transistor's gate structure. The multilayered inner spacer can have a first dielectric layer and a second dielectric layer formed at sides of the first dielectric layer. Both the first and second dielectric layers can be in contact with the transistor's gate structure. The first dielectric layer can be formed prior to forming the transistor's S/D region, and the second dielectric layer can be formed after forming the transistor's S/D region. The second dielectric layer can protect the S/D region's structural integrity during the subsequent fabrication process of defining the transistor's nano-sheet channels. A benefit of the present disclosure, among others, is to avoid the S/D region's damage and improve electrical insulation between the S/D region and the gate structure, thus improving the GAA FET's reliability and yield.

Figure 1B:
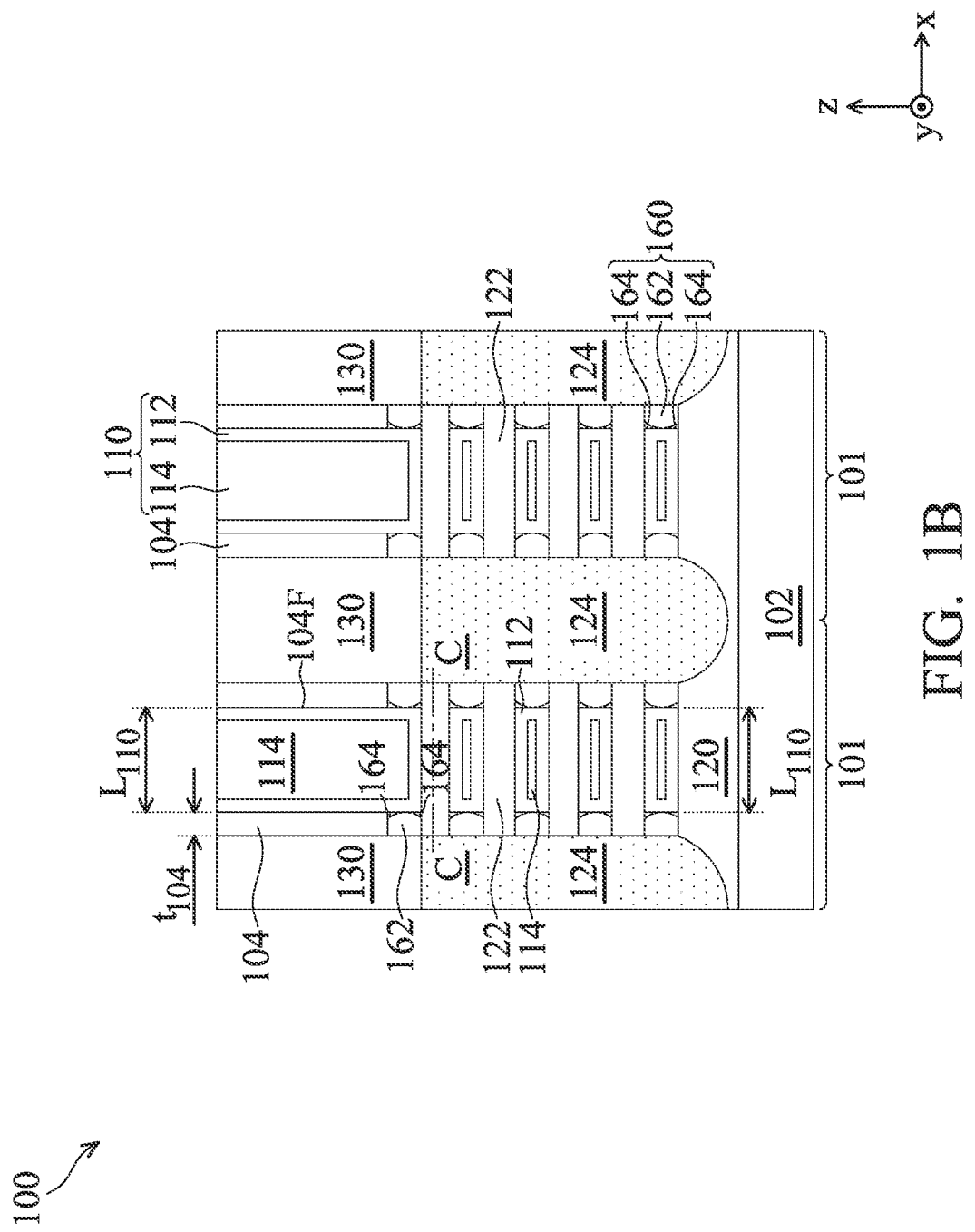
FIGS. 1B and 1C are cross-sectional views of a semiconductor device, according to some embodiments.
Figure 1C:
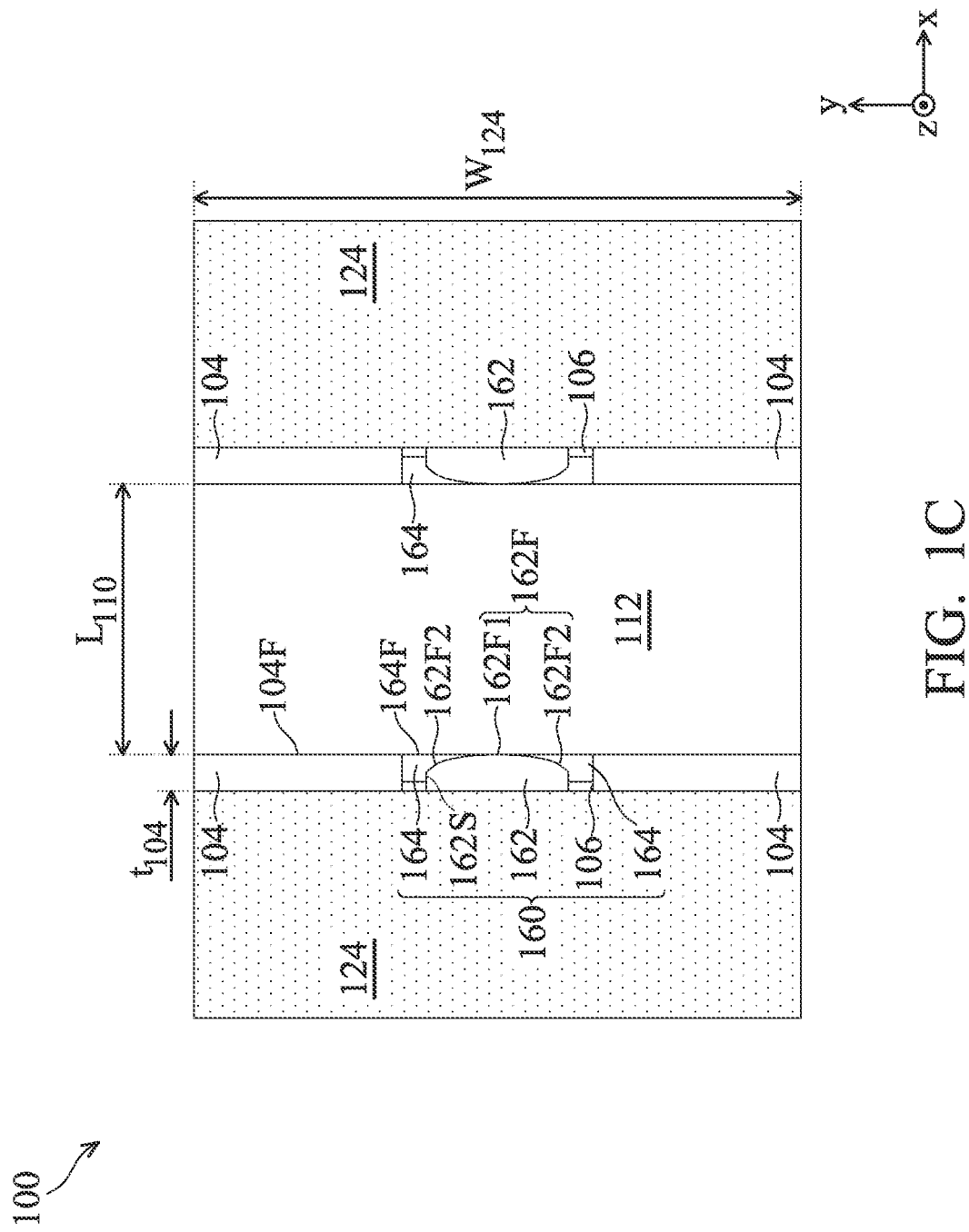

A semiconductor device 100 having multiple FETs 101 formed over a substrate 102 is described with reference to FIGS. 1A-1C, according to some embodiments. FIG. 1A illustrates an isometric view of semiconductor device 100, according to some embodiments. FIG. 1B illustrates a cross-sectional (e.g., along the x-z plane) view of semiconductor device 100 along line B-B of FIG. 1A, according to some embodiments. FIG. 1C illustrates a cross-sectional (e.g., along the x-y plane) view of semiconductor device 100 along line C-C of FIG. 1B, according to some embodiments. The discussion of elements in FIGS. 1A-1C with the same annotations applies to each other, unless mentioned otherwise. Semiconductor device 100 can be included in a microprocessor, memory cell, or other integrated circuit (IC). Also, each FET 101 shown in FIGS. 1A-1C can be a GAA FET, according to some embodiments.

Referring to FIGS. 1A-1C, substrate 102 can be a semiconductor material, such as silicon. In some embodiments, substrate 102 can include a crystalline silicon substrate (e.g., wafer). In some embodiments, substrate 102 can include (i) an elementary semiconductor, such as silicon (Si) or germanium (Ge); (ii) a compound semiconductor including silicon carbide (SiC), gallium arsenide (GaAs), gallium phosphide (GaP), indium phosphide (InP), indium arsenide (InAs), and/or indium antimonide (InSb); (iii) an alloy semiconductor including silicon germanium carbide (SiGeC), silicon germanium (SiGe), gallium arsenic phosphide (GaAsP), gallium indium phosphide (InGaP), gallium indium arsenide (InGaAs), gallium indium arsenic phosphide (InGaAsP), aluminum indium arsenide (InAlAs), and/ or aluminum gallium arsenide (AlGaAs): or (iv) a combination thereof. Further, substrate 102 can be doped depending on design requirements (e.g., p-type substrate or n-type substrate). In some embodiments, substrate 102 can be doped with p-type dopants (e.g., boron (B), indium (In), aluminum (Al), or gallium (Ga)) or n-type dopants (e.g., phosphorus (P) or arsenic (As)).

FET 101 can include a fin structure 108 extending along an x-direction, a gate structure 110 traversing through fin structure 108 along a y-direction, and S/D regions 124 formed over portions of fin structure 108. Although FIG. 1A shows fin structure 108 accommodating two FETs 101, any number of FETs 101 can be disposed along fin structure 108. In some embodiments, FET 101 can include multiple fin structures 108 extending along a first horizontal direction (e.g., in the x-direction) and gate structure 110 traversing through the multiple tin structures 108 along a second horizontal direction (e.g., in the y direction).

Fin structure 108 can include a buffer region 120 formed over substrate 102. Fin structure 108 can further include one or more channel regions 122 formed over buffer region 120. Each channel region 122 can be wrapped by gate structure 110 to function as FET 101's channel. For example, a top surface, side surfaces, and a bottom surface of each channel region 122 can be surrounded and in physical contact with gate structure 110. Buffer region 120 and channel region 122 can be made of materials similar to (e.g., lattice mismatch within 5%) substrate 102. In some embodiments, each of buffer region 120 and channel region 122 can be made of Si or SiGe. Each of buffer region 120 and channel region 122 can be un-doped, doped with p-type dopants, doped with n-type dopants, or doped with intrinsic dopants. In some embodiments, buffer region 120 and channel regions 122 can be together doped with p-type dopants or together doped with n-type dopants.

Gate structure 110 can be a multilayered structure that wraps around each channel region 122 to modulate FET 101. Gate structure 110 can have a length $L_{110}$ representing FET 101's channel length. Length $L_{110}$ can have any suitable horizontal (e.g., in the x-direction) dimension, such as from about 5 nm to about 200 nm. Gate structure 110 can include a gate dielectric layer 112 and a gate electrode 114 disposed on dielectric layer 112. Gate dielectric layer 112 can include any suitable dielectric material with any suitable thickness that can provide channel modulation for FET 101. In some embodiments, gate dielectric layer 112 can be made of silicon oxide or a high-k dielectric material (e.g., hafnium oxide or aluminum oxide). In some embodiments, gate dielectric layer 112 can have a thickness ranging from about 1 nm to about 5 nm. Based on the disclosure herein, other materials and thicknesses for gate dielectric layer 112 are within the scope and spirit of this disclosure. Gate electrode 114 can function as a gate terminal for FET 101. Gate electrode 114 can include any suitable conductive material that provides a suitable work function to modulate FET 101. In some embodiments, gate electrode 114 can be made of titanium nitride, tantalum nitride, tungsten nitride, titanium, aluminum, copper, tungsten, tantalum, copper, or nickel. Based on the disclosure herein, other materials for gate electrode 114 are within the scope and spirit of this disclosure.

S/D regions 124 can be formed over opposite sides (e.g., along x-direction) of each channel region 122 to function as FET 101's source and drain terminals. S/D region 124 can have any suitable lateral (e.g, in the y-direction) width $W_{124}$ such as from about 20 nm to about 200 nm. S/D region 124 can be made of an epitaxially-grown semiconductor material similar to (e.g., lattice mismatch within 5%) channel region 122. In some embodiments, S/D region 124 can be made of Si, Ge, SiGe, InGaAs, or GaAs. S/D region 124 can be doped with p-type dopants, n-type dopants, or intrinsic dopants. In some embodiments, S/D region 124 can have a different doping type from channel region 122.

Semiconductor device 100 can further include a gate spacer 104 formed between gate structure 110 and S/D region 124. Gate spacer 104 can have a front surface 104F (shown in FIG. 1C) formed over and in contact with gate structure 110. In some embodiments, gate spacer 104 can be further formed over fin structure 108's side surface. Gate spacer 104 can be made of any suitable dielectric material. In some embodiments, gate spacer 104 can be made of silicon oxide, silicon nitride, or a low-k material with a dielectric constant less than about 3.9. In some embodiments, gate spacer 104 can have any suitable thickness $t_{104}$, such as from about 5 nm to about 15 nm. Based on the disclosure herein, other materials and thicknesses for gate spacer 104 are within the scope and spirit of this disclosure.

Semiconductor device 100 can further include shallow trench isolation (STI) regions 138 (shown in FIG. 1A) configured to provide electrical isolation between fin structures 108. Also, STI regions 138 can provide electrical isolation between FET 101 and neighboring active and passive elements (not shown in FIG. 1A) integrated with or deposited on substrate 102. STI regions 138 can include one or more layers of dielectric material, such as a nitride layer, an oxide layer disposed on the nitride layer, and an insulating layer disposed on the nitride layer. In some embodiments, the insulating layer can include silicon oxide, silicon nitride, silicon oxynitride, fluorine-doped silicate glass (FSG), a low-k dielectric material, and/or other suitable insulating materials. Based on the disclosure herein, other dielectric materials for STI region 138 are within the scope and spirit of this disclosure.

Semiconductor device 100 can further include an interlayer dielectric (ILD) layer 130 (shown in FIGS. 1A and 1B) to provide electrical isolation to structural elements it surrounds or covers, such as gate structure 110 and S/D regions 124. In some embodiments, gate spacer 104 can be formed between gate structure 110 and ILD layer 130. ILD layer 130 can include any suitable dielectric material to provide electrical insulation, such as silicon oxide, silicon dioxide, silicon oxycarbide, silicon oxynitride, silicon oxy-carbon nitride, and silicon carbonitride. ILD layer 130 can have any suitable thickness, such as from about 50 nm to about 200 nm, to provide electrical insulation. Based on the disclosure herein, other insulating materials and thicknesses for ILD layer 130 are within the scope and spirit of this disclosure.

Semiconductor device 100 can further include an inner spacer structure 160 formed protruding into fin structure 108. Inner spacer structure 160 can separate gate structure 110 from S/D region 124. For example, inner spacer structure 160 can be formed at gate structure 110's opposite sides along FET 101's channel direction (e.g., along the x-direction) to separate gate structure 110 from S/D region 124. In some embodiments, inner spacer structure 160 can be formed between two laterally (e.g., in the y-direction) adjacent gate spacers 104. In some embodiments, inner spacer structure 160 can be formed between two vertically (e.g., in the z-direction) adjacent channel regions 122. In some embodiments, inner spacer structure 160 can be formed between buffer region 120 and channel region 122. In some embodiments, inner spacer structure 160 can be formed between gate structure 110 and ILD layer 130.

Referring to FIGS. 1B and 1C, inner spacer structure 160 can include a first inner spacer 162 extending from gate structure 110 to S/D region 124. First inner spacer 162 can be formed in fin structure 108. For example, first inner spacer 162 can be formed between and in contact with two vertically (e.g., in the z-direction) adjacent channel regions 122. First inner spacer 162 can be separated from the laterally (e.g., in the y-direction) adjacent gate spacers 104. For example, first inner spacer 162 can have side surfaces 162S (shown in FIG. 1C) separated from the laterally (e.g., in the y-direction) adjacent gate spacers 104. In some embodiments, first inner spacer 162's side surface 162S can be substantially perpendicular to substrate 102. In some embodiments, first inner spacer 162's side surface 162S can be substantially parallel with channel region 122's side surface. First inner spacer 162 can further have a front surface 162F (shown in FIG. 1C) proximate to gate structure 110. Front surface 162F can have a first portion 162F1 (shown in FIG. 1C) proximate to front surface 162F's midpoint (e.g., proximate to front surface 162F's vertex) and a second portion 162F2 (shown in FIG. 1C) proximate to side surface 162S. In some embodiments, front surface 162F can be a substantially planar surface (not shown in FIG. 1C), where front surface 162F can be in contact with gate structure 110. In some embodiments, front surface 162F and gate spacer 104's front surface 104F can be substantially coplanar with gate structure 110. In some embodiments, front surface 162F can be a curved surface, where front surface 162F's first portion 162F1 can be in contact with gate structure 110, and front surface 162F's second portion 162F2 can be separated from gate structure 110. In some embodiments, first portion 162F1 and gate spacer 104's front surface 104F can be substantially coplanar with gate structure 110. In some embodiments, gate spacer 104's front surface 104F can be substantially coplanar with gate structure 110, and first inner spacer 162's front surface 162F (e.g., both first and second portions 162F1 and 162F2) can protrude into gate structure 110 (not shown in FIGS. 1A-1C). In some embodiments, first and second portions 162F1 and 162F2 can be substantially coplanar with each other (not shown in FIG. 1C). In some embodiments, first and second portions 162F1 and 162F2 can be separated from gate structure 110 (not shown in FIG. 1C). First inner spacer 162 can further have a back surface, horizontally (e.g., in the x-direction) opposite to front surface 162F, in contact with S/D region 124. In some embodiments, first inner spacer 162's back surface and the laterally (e.g., in the y-direction) adjacent gate spacers 104 can be substantially coplanar with S/D region 124. First inner spacer 162 can be made of any suitable insulating material to electrically separate gate structure 110 from S/D region 124. In some embodiments, first inner spacer 162 can be made of amorphous silicon, silicon oxide, silicon nitride, aluminum oxide, hafnium oxide, or a low-k dielectric material. In some embodiments, first inner spacer 162 can be made of dielectric materials free from carbon, chlorine, and/or fluorine. Based on the disclosure herein, other materials for first inner spacer 162 are within the scope and limit of this disclosure.

Inner spacer structure 160 can further include a second inner spacer 164 formed between first inner spacer 162 and the laterally (e.g., in the y-direction) adjacent gate spacers 104. For example, second inner spacer 164 can be formed over first inner spacer 162's side surfaces 162S and in contact with laterally (e.g., in the y-direction) adjacent gate spacers 104. Second inner spacer 164 can have a front surface 164F (shown in FIG. 1C) in contact with gate structure 110. In some embodiments, second inner spacer 164 can be further formed over front surface 162F's second portion 162F2, where second inner spacer 164's front surface 164F can be positioned between gate structure 110 and front surface 162F's second portion 162F2. In some embodiments, front surface 162F's first portion 162F1 and second inner spacer 164's front surface 164F can be substantially coplanar with gate structure 110. In some embodiments, gate spacer 104's front surface 104F can be substantially coplanar with gate structure 110, and second inner spacer 164's front surface 164F can protrude into gate structure 110 (not shown in FIGS. 1A-1C). Second inner spacer 164 can be made of any suitable insulating material to electrically separate gate structure 110 from S/D region 124. In some embodiments, second inner spacer 164 can be made of an oxide material, such as silicon oxide and silicon oxynitride (SiON). In some embodiments, second inner spacer 164 can be made of an carbon-contained oxide material, such as silicon oxycarbide (SiOC) and silicon oxycarbonitride (SiNOC). In some embodiments, second inner spacer 164 can be made of a polymer material. In some embodiments, second inner spacer 164 can be made of an oxide material that can include carbon, chlorine, and/or fluorine (discussed in method 200), and first inner spacer 162 and/or third inner spacer 106 (discussed below) can be made of dielectric materials free from carbon, chlorine, and/or fluorine. In some embodiments, first and second inner spacers 164 and 162 can be made of different material from each other.

Inner spacer structure 160 can further include a third inner spacer 106 (shown in FIG. 1C) formed between first inner spacer 162 and the laterally (e.g., in the y-direction) adjacent gate spacers 104. For example, third inner spacer 106 can be formed over first inner spacer 162's side surfaces 162S and in contact with the laterally (e.g., in the y-direction) adjacent gate spacers 104. Third inner spacer 106 can be further formed proximate to S/D region 124 and separated from gate structure 110. For example, third inner spacer 106 can be formed over a first portion of first inner spacer 162's side surfaces 162S that is proximate to S/D region 124, and second inner spacer 164 can be formed over a second portion of first inner spacer 162's side surfaces 162S that is proximate to gate structure 110. In some embodiments, third inner spacer 106 and gate spacer 104 can be substantially coplanar with S/D region 124. Third inner spacer 106 can be made of any suitable insulating material to electrically separate gate structure 110 from S/D region 124. In some embodiments, third inner spacer 106 can be made of an oxide material, such as silicon oxide. In some embodiments, third inner spacer 106 can be made of dielectric materials free from carbon, chlorine, and/or fluorine. In some embodiments, third inner spacer 106 and second inner 162 spacer can be made of oxide materials that can have different oxide concentrations from each other. In some embodiments, first, second, and third inner spacers 164, 162, and 106 can be made of different materials from one another. Based on the disclosure herein, other materials for third inner spacer 106 are within the scope and limit of this disclosure.

Figure 2:
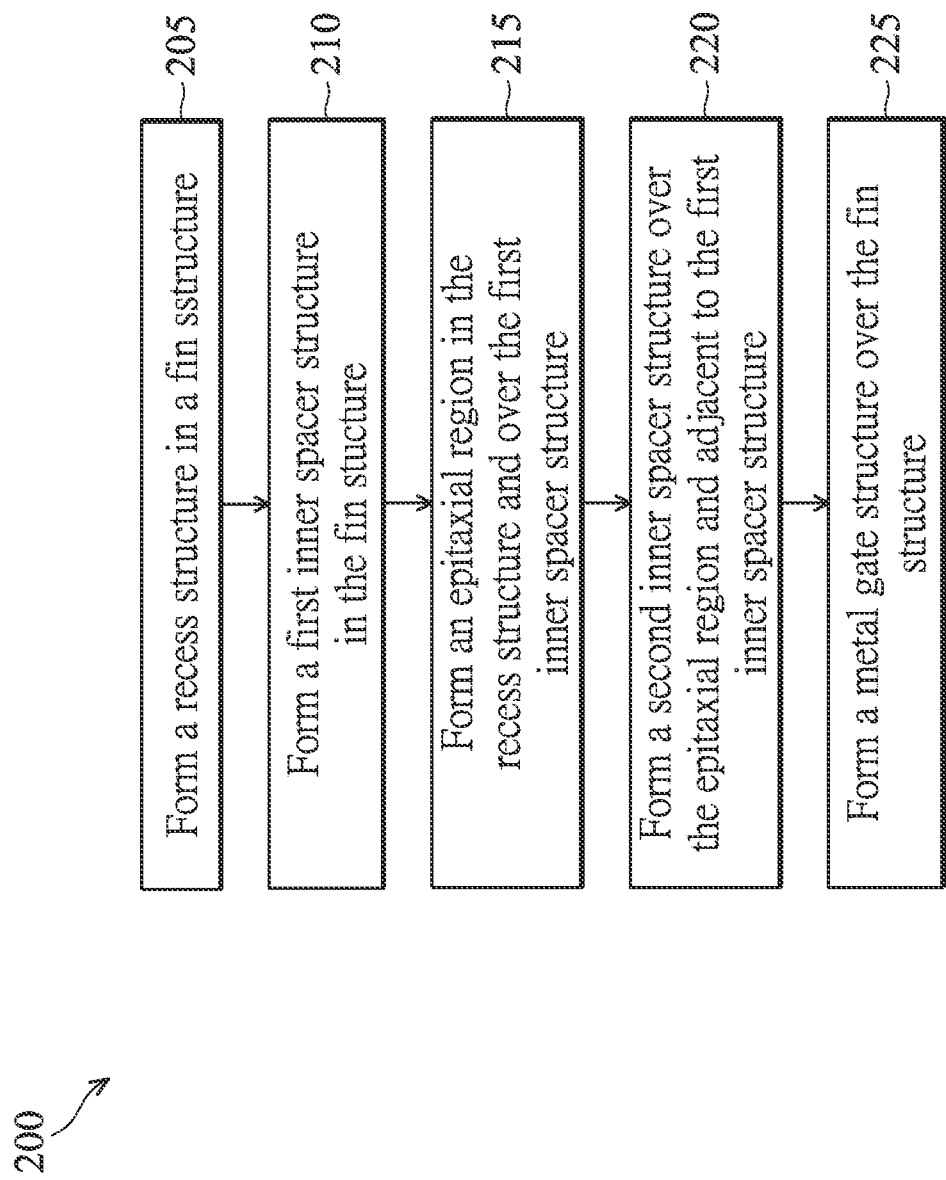
FIG. 2 is a flow diagram of a method for fabricating a semiconductor device, according to some embodiments.
Figure 3:
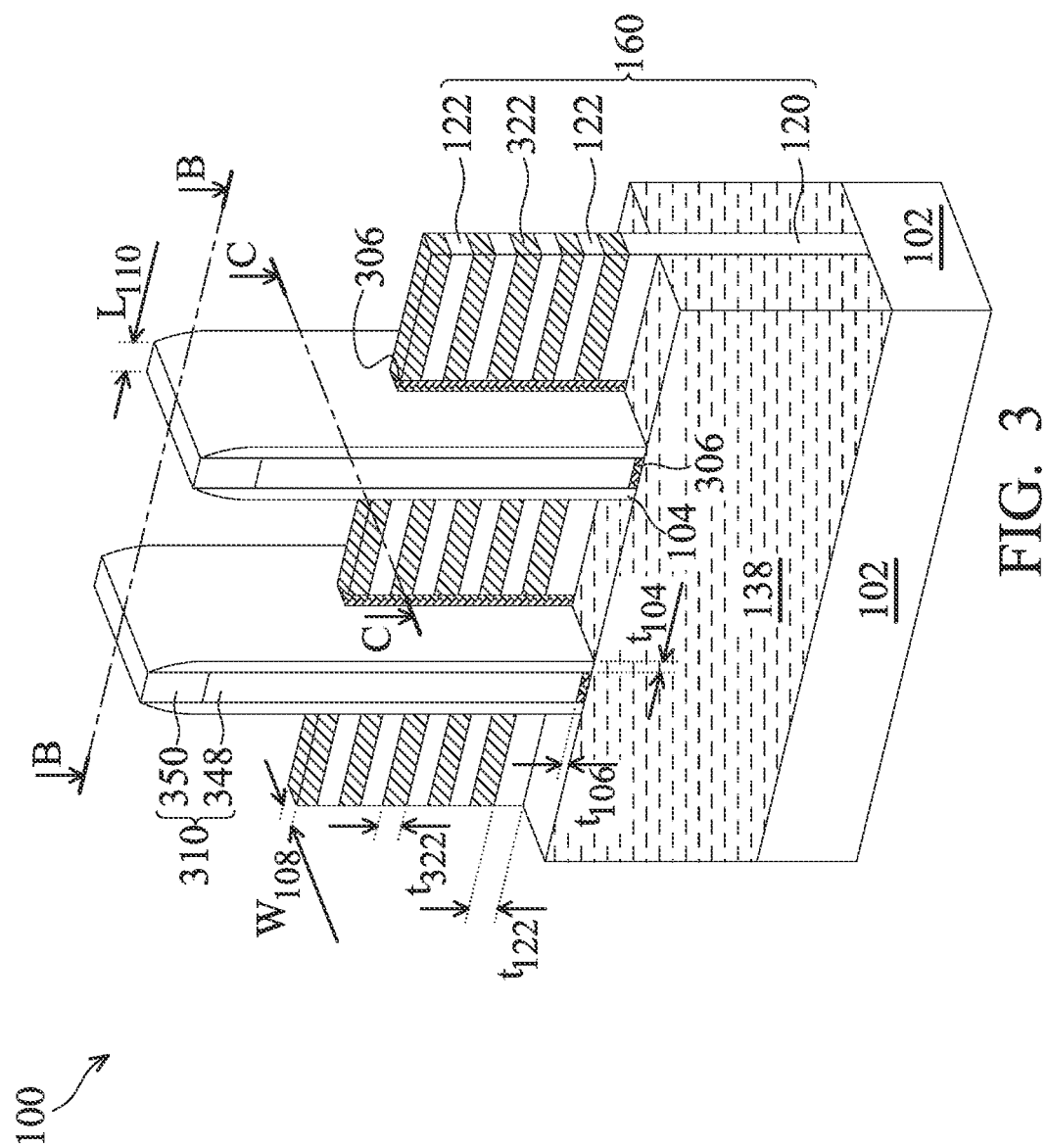
FIG. 3 is an isometric view of a semiconductor device at a stage of its fabrication process, according to some embodiments.
Figure 12:
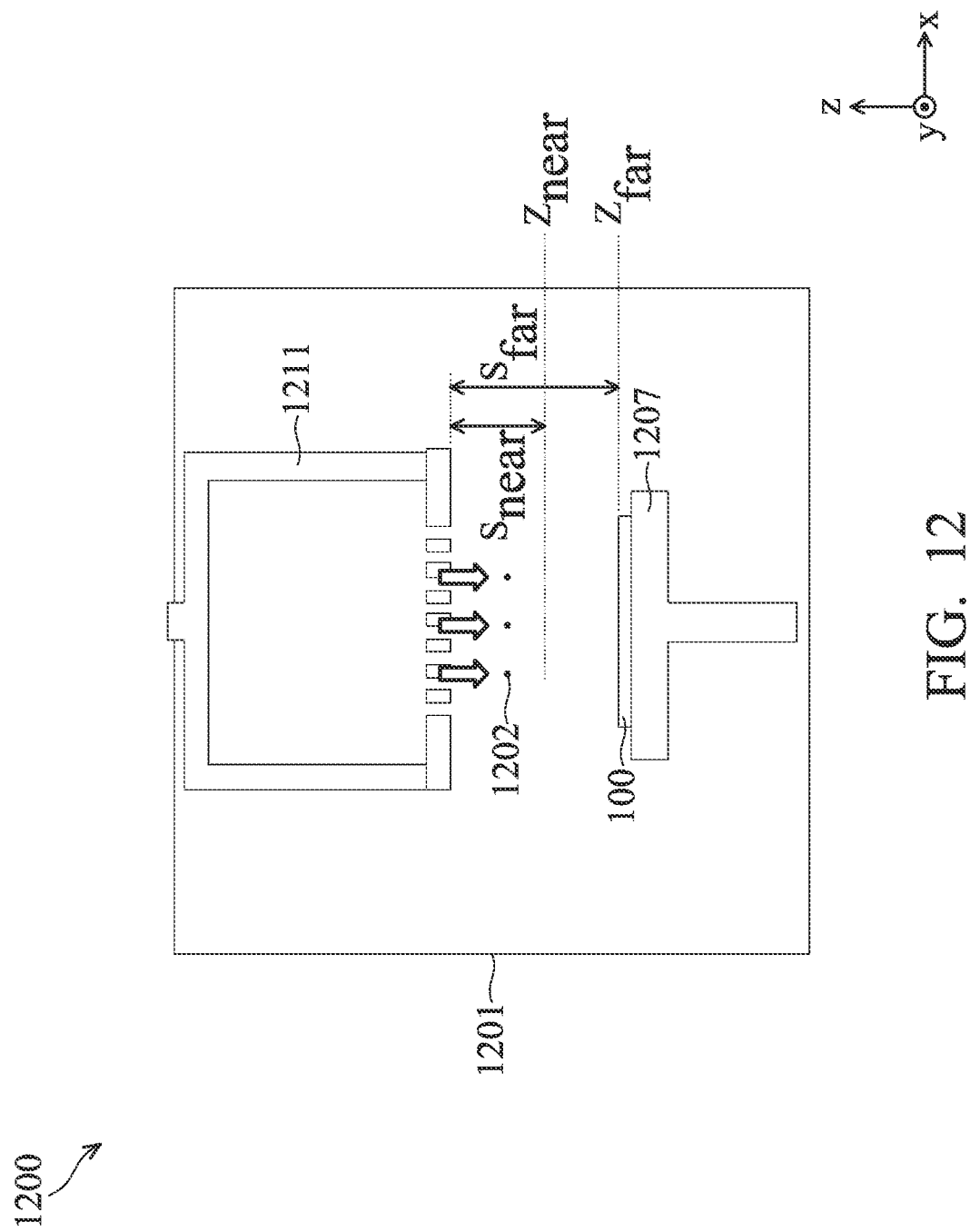
FIG. 12 illustrates a plan view of a semiconductor device manufacturing apparatus, according to some embodiments.
Figure 13:
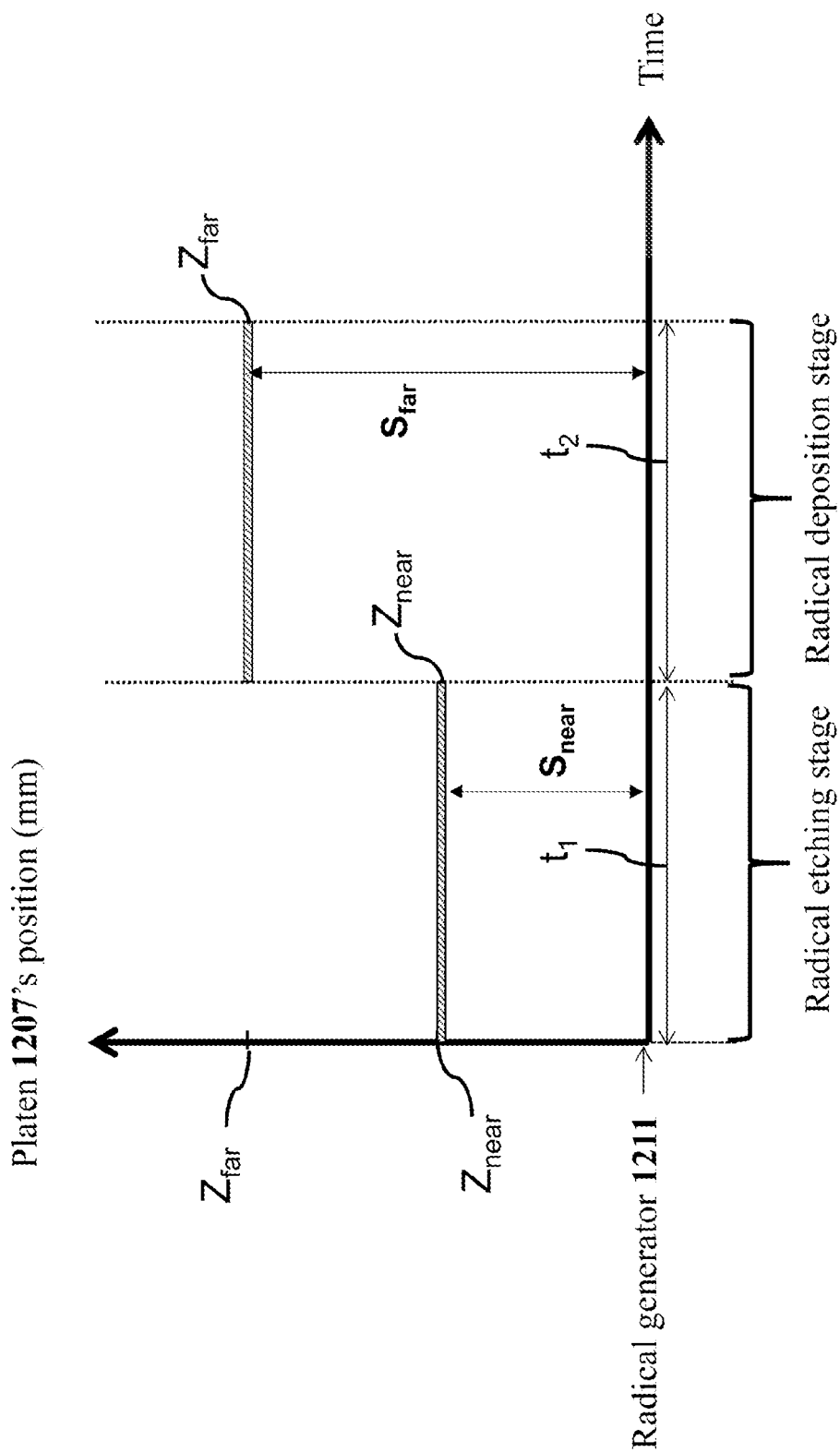
FIG. 13 illustrates various operating position of a platen of a semiconductor device manufacturing apparatus, according to some embodiments.

FIG. 2 is a flow diagram of a method 200 for fabricating semiconductor device 100, according to some embodiments. For illustrative purposes, the operations illustrated in FIG. 2 will be described with reference to the example fabrication process for fabricating semiconductor device 100 as illustrated in FIGS. 3, 4A-11A, 4B-11B, and 12. FIG. 3 illustrates an isometric view of semiconductor device 100 at a stage of its fabrication, according to some embodiments. FIGS. 4A-11A and 4B-11B illustrate cross-sectional views along lines B-B and C-C, respectively, of structure of FIG. 3 at various stages of its fabrication, according to some embodiments. FIG. 12 illustrates an exemplary apparatus for forming inner spacer structure 160 in method 200, according to some embodiments. FIG. 13 illustrates various operating positions of a platen of the exemplary apparatus for forming inner spacer structure 160 in method 200, according to some embodiments. Operations can be performed in a different order or not performed depending on specific applications. Method 200 may not produce a complete semiconductor device 100. Accordingly, it is understood that additional processes can be provided before, during, and/or after method 200, and that some other processes may be briefly described herein. Further, the discussion of elements in FIGS. 1A-1C, 3, 4A-11A, 4B-11B, and 12 with the same annotations applies to each other, unless mentioned otherwise.

Referring to FIG. 2, in operation 205, a recess structure is formed in a fin structure. For example, a recess structure 436 (shown in FIGS. 4A and 4B) can be formed in fin structure 108 (shown in FIG. 4A) with reference to FIGS. 3, 4A, and 4B. The process of forming recess structure 436 can include (i) forming fin structures 108 (shown in FIG. 3) over substrate 102; (ii) forming STI region 138 (shown in FIG. 3) over the etched substrate 102 using a deposition process and an etch back process; (iii) forming sacrificial gate structures 310 (shown in FIG. 3) with length $L_{110}$ over fin structures 108; and (iv) removing fin structures 108 through sacrificial gate structures 310 to form recess structure 436.

Referring to FIG. 3, the process of forming fin structures 108 can include (i) providing substrate 102; (ii) epitaxially growing channel regions 122 and sacrificial layers 322 over substrate 102; and (iii) etching channel regions 122, sacrificial layers 322, and substrate 102 through a patterned mask layer (not shown in FIG. 3) using an etching process.

Sacrificial layer 322 can be made of materials different from channel region 122 and similar to (e.g., lattice mismatch within 5%) substrate 102. In some embodiments, sacrificial layer 322 can be made of SiGe, and channel region 122 can be made of Si. In some embodiments, sacrificial layer 322 and channel region 122 can be made of SiGe with different atomic percentage of Ge from each other. Channel region 122 and sacrificial layer 322 can have suitable thicknesses $t_{122}$ and $t_{322}$, respectively. In some embodiments, each of thicknesses $t_{122}$ and $t_{322}$ can be from about 5 nm to about 10 nm. Channel region 122 and sacrificial layer 322 can be epitaxially grown using any suitable epitaxial growth process, such as a chemical vapor deposition (CVD) process, a low pressure CVD (LPCVD) process, a rapid thermal CVD (RTCVD) process, a metal-organic CVD (MOCVD) process, an atomic layer CVD (ALCVD) process, an ultrahigh vacuum CVD (UHVCVD) process, a reduced pressure CVD (RPCVD) process, a molecular beam epitaxy (MBE) process, a cyclic deposition-etch (CDE) process, and a selective epitaxial growth (SEG) process. Based on the disclosure herein, other materials, thicknesses, and epitaxial growth processes for channel region 122 and sacrificial layer 322 are within the scope and limit of this disclosure.

The etching process for removing channel region 122, sacrificial layer 322 and substrate 102 can include a dry etching process or a wet etching process to define fin structure 108 with any suitable width $W_{108}$, such as from about 5 nm to about 50 nm. In some embodiments, the dry etching process can include using any suitable etchant, such as an oxygen-containing gas, a fluorine-containing gas, a chlorine-containing gas, and a bromine-containing gas, and the wet etching process can include etching in any suitable wet etchant, such as diluted hydrofluoric acid, potassium hydroxide solution, ammonia, and nitric acid. Based on the disclosure herein, other widths and etching processes for fin structure 108 are within the scope and limit of this disclosure.

The deposition process for forming STI region 138 can include any suitable growth process, such as a physical vapor deposition (PVD) process, a CVD process, a high-density-plasma (HDP) CVD process, a flowable CVD (FCVD) process, and an atomic layer deposition (ALD) process. The etch back process for forming STI region 138 can include a dry etching process, a wet etching process, or a polishing process, such as chemical vapor deposition (CMP) process. Based on the disclosure herein, other processes for forming STI region 138 are within the spirit and scope of this disclosure.

The process of forming sacrificial gate structure 310 can include (i) blanket depositing a dielectric layer 306 with a suitable thickness $t_{106}$, such as from about 1 nm to about 5 nm, over fin structures 108 using a suitable deposition process, such as a CVD process, a PVD process, and an ALD process; (ii) blanket depositing a polysilicon layer 348 and a hard mask layer 350 over dielectric layer 306 using a suitable deposition process, such as a CVD process, a PVD process, and an ALD process; (iii) removing dielectric layer 306, polysilicon layer 348 and hard mask layer 350 through a patterned mask layer (not shown in FIG. 3) using an etching process; and (iv) forming gate spacers 104 with a suitable thickness $t_{104}$, such as from about 5 nm to about 15 nm, over side surfaces of polysilicon layer 348 and/or over fin structure 108's side surfaces using a suitable deposition process and an etching process. In some embodiments, the deposition process for dielectric layer 306 can use any suitable chlorine-free processing gases and/or fluorine-free processing gases. In some embodiments, dielectric layer 306 can be made of a same material as third inner spacer 106. Based on the disclosure herein, other processes for forming gate structures 310 are within the spirit and scope of this disclosure.

Figure 4A:
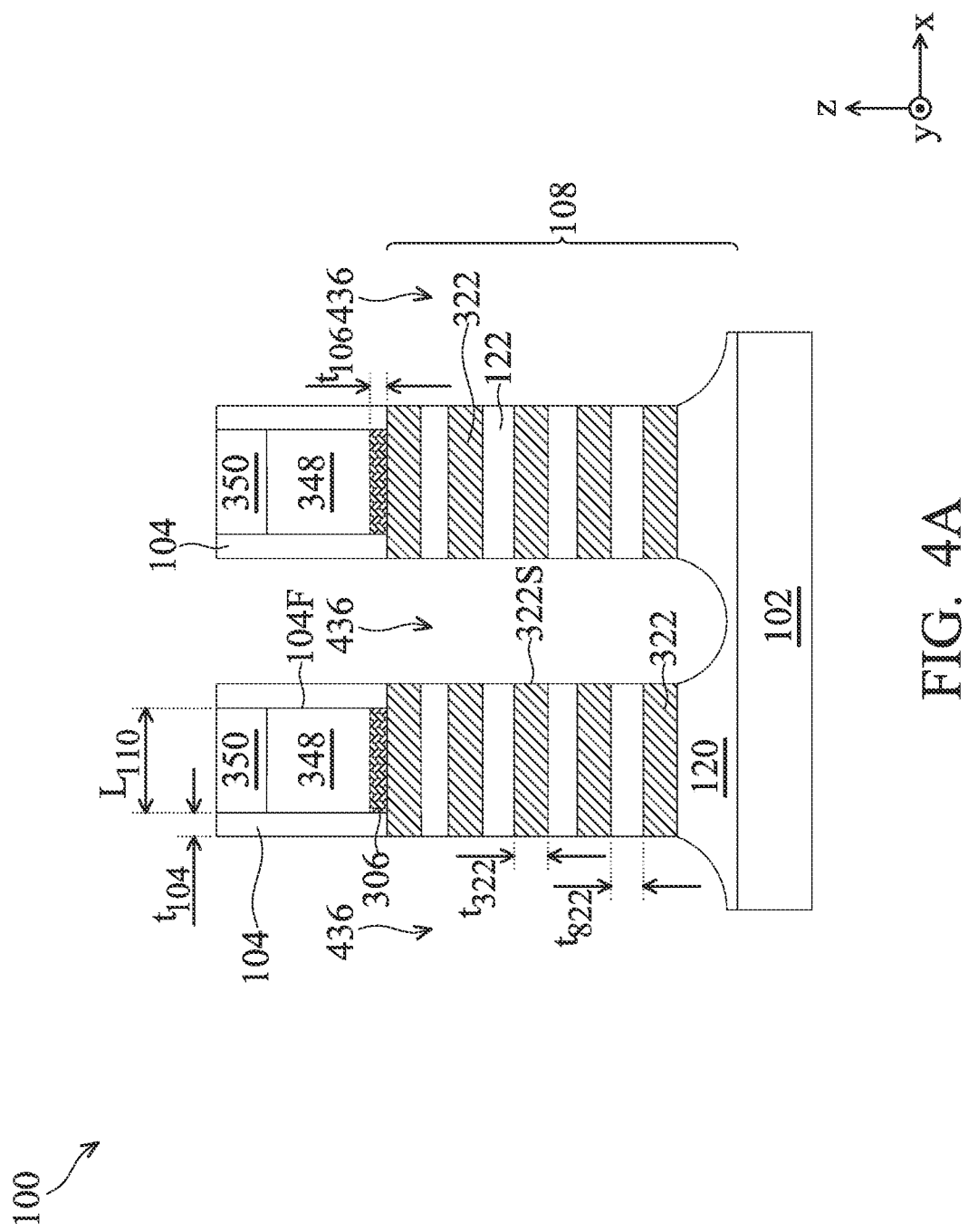
Figure 4B:
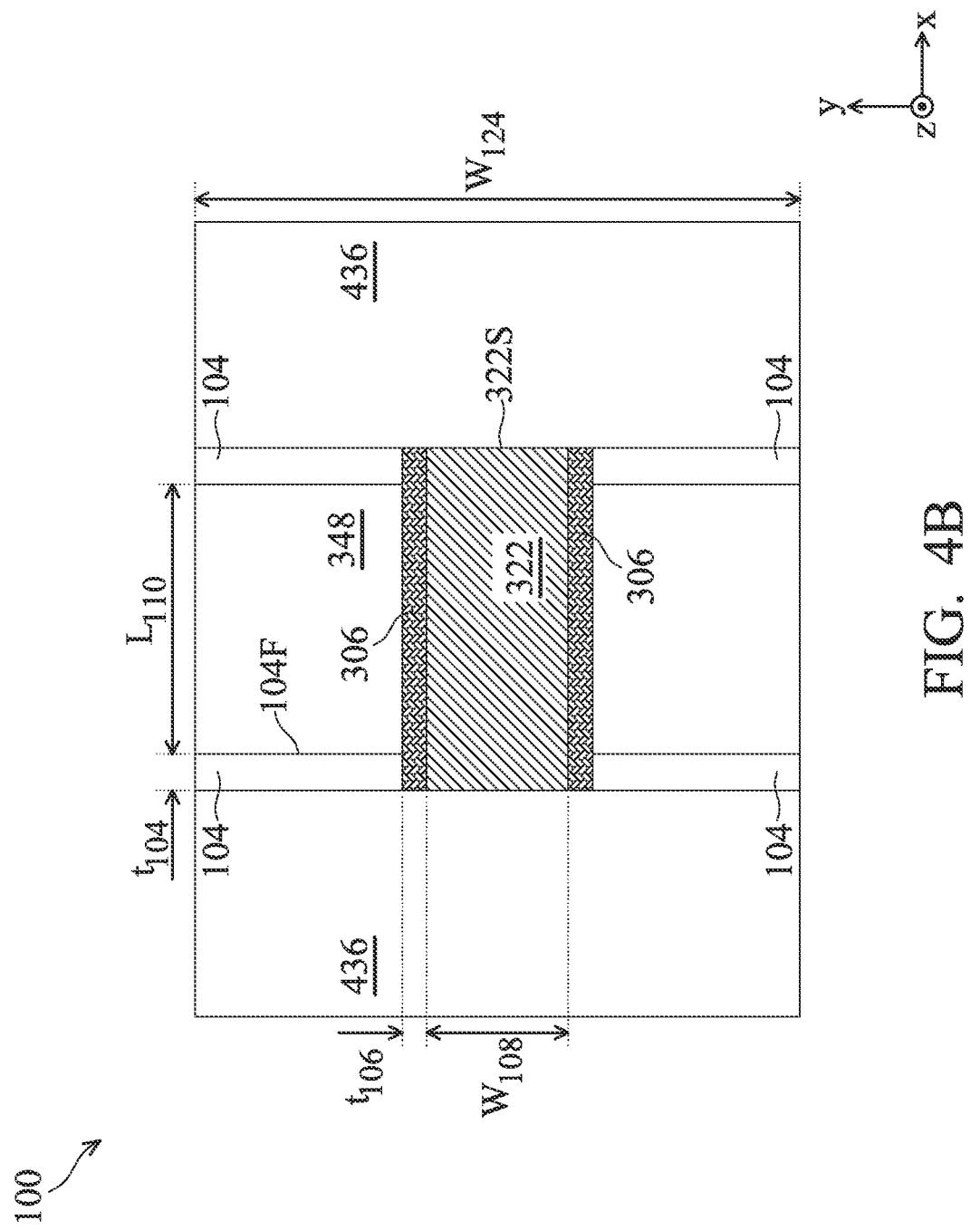

Referring to FIGS. 4A and 4B, after forming sacrificial gate structure 310, recess structure 436 can be formed by removing channel regions 122, sacrificial layers 322, and substrate 102 through sacrificial gate structures 310 and gate spacers 104 using an etching process. The etching process can include a dry etching process or a wet etching process. In some embodiments, the etching process can be a time-etching process. In some embodiments, the dry etching process can include using any suitable etchant, such as an oxygen-containing gas, a fluorine-containing gas, a chlorine-containing gas, and a bromine-containing gas, and the wet etching process can include etching in any suitable wet etchant, such as diluted hydrofluoric acid, potassium hydroxide solution, ammonia, and nitric acid. As shown in FIG. 4A, the resulting recess structure 436 can expose fin structure 108's side surface 322S. In some embodiments, side surface 322S can represent side surfaces of sacrificial layers 322 that are under poly silicon layer 348 and gate spacers 104. In some embodiments, side surface 322S can represent side surfaces of channel regions 122 that are under polysilicon layer 348 and gate spacers 104. Further, as shown in FIG. 4B, the resulting recess structure 436 can expose gate spacers 104 that are laterally (e.g., in the y-direction) adjacent to dielectric layers 306 and sacrificial layers 322. Accordingly, gate spacers 104 can have front surface 104F in contact with polysilicon layer 348 and a back surface, opposite to front surface 104F, exposed by recess structure 436.

Figure 5A:
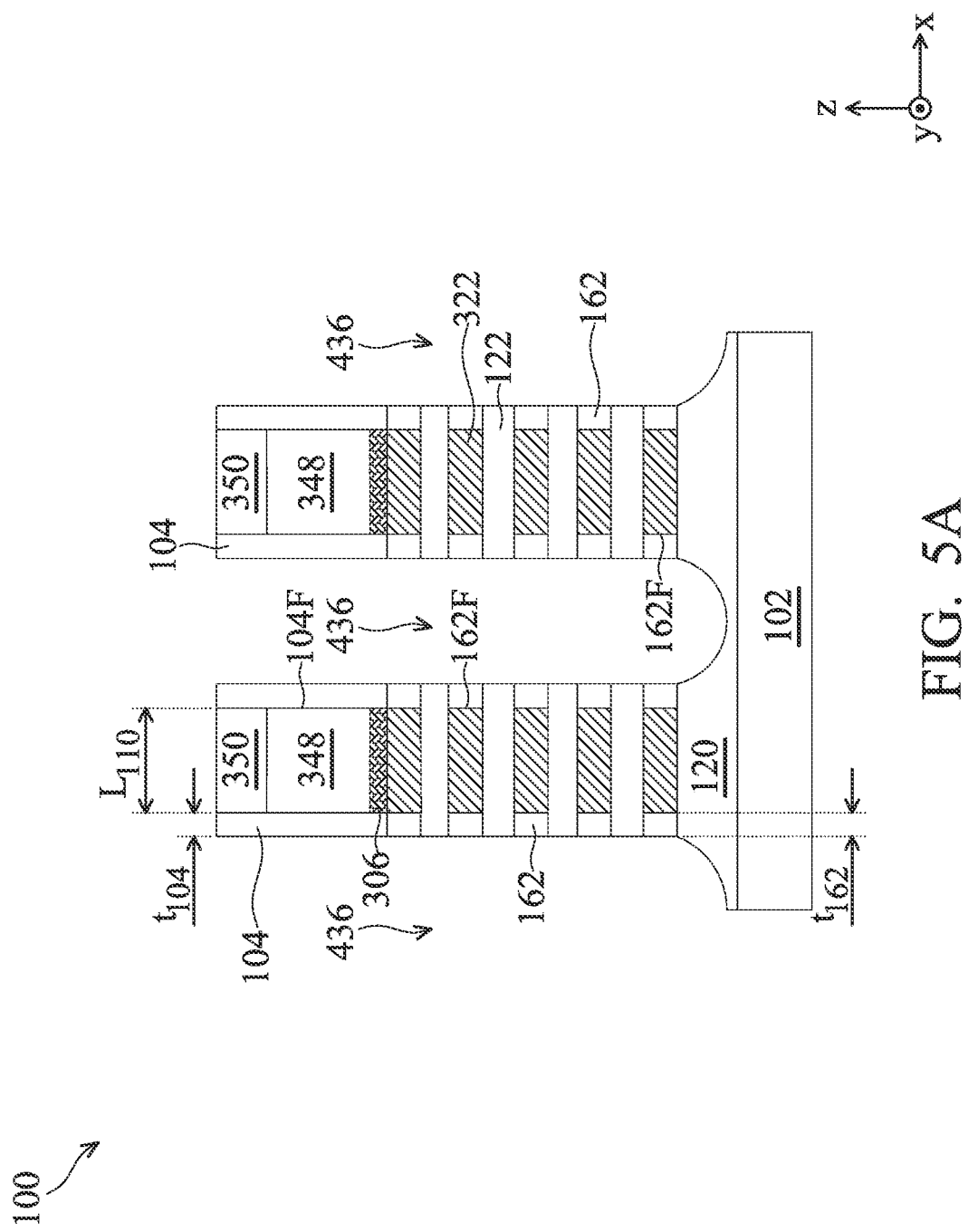

Referring to FIG. 2, in operation 210, a first inner spacer structure is formed in the fin structure. For example, first inner spacers 162 (shown in FIGS. 5A and 5B) can be formed in fin structure 108 of FIGS. 4A and 4B. The process of forming first inner spacer 162 can include (i) forming recess structures (not shown in FIGS. 5A and 5B) in sacrificial layers 322 using a selective etching process that can selectively etch sacrificial layer 322 from channel region 122; (ii) blanket depositing first inner spacer 162 in recess structure 436 and in the recess structures in sacrificial layers 322 using a deposition process, such as a CVD process, a PVD process, and an ALD process; and (iii) removing first inner spacer 162 through polysilicon layer 348 and gate spacers 104 using an etching process to define first inner spacer 162 with any suitable thickness $t_{162}$, such as from about 3 nm to about 10 nm, protruding into sacrificial layers 322. In some embodiments, first inner spacer 162's thickness $t_{162}$ can be substantially equal to or greater than gate spacer 104's thickness $t_{104}$. In some embodiments, the deposition process for first inner spacer 162 can use any suitable chlorine-free processing gases and/or fluorine-free processing gases. The resulting first inner spacer 162 can have front surface 162F (e.g., first and second portions 162F1 and 162F2 as shown in FIG. 5B) protruding into and in contact with sacrificial layer 322. The resulting first inner spacer 162 can further have side surface 162S in contact with laterally (e.g., in the y-direction) adjacent dielectric layers 306. In some embodiments, the resulting first inner spacer 162's back surface, opposite to front surface 162F, can be substantially coplanar with dielectric layer 306 and laterally (e.g., in the y-direction) adjacent gate spacers 104. Based on the disclosure herein, other thicknesses and other etching processes for forming first inner spacer 162 are within the spirit and scope of this disclosure.

Figure 6A:
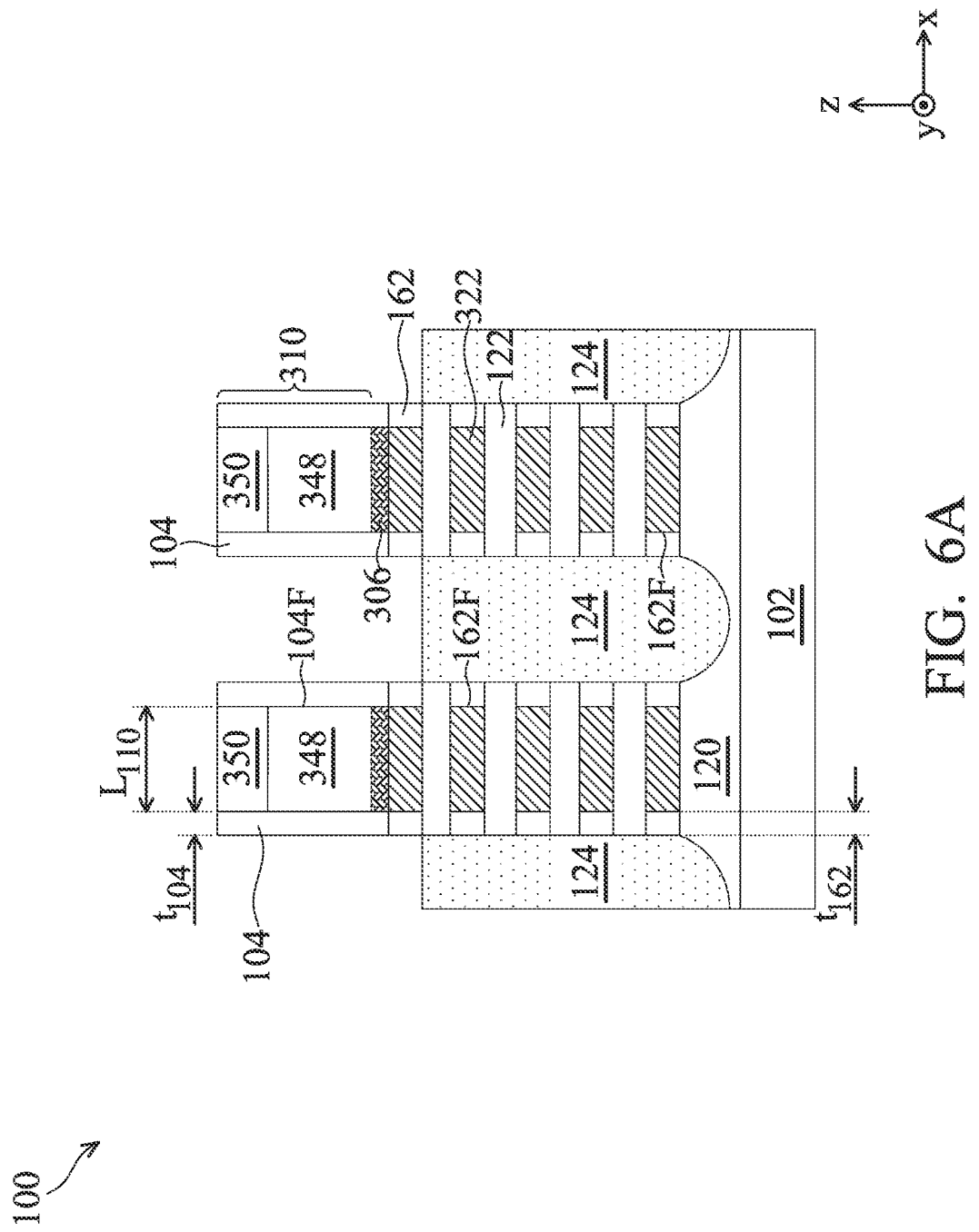
Figure 6B:
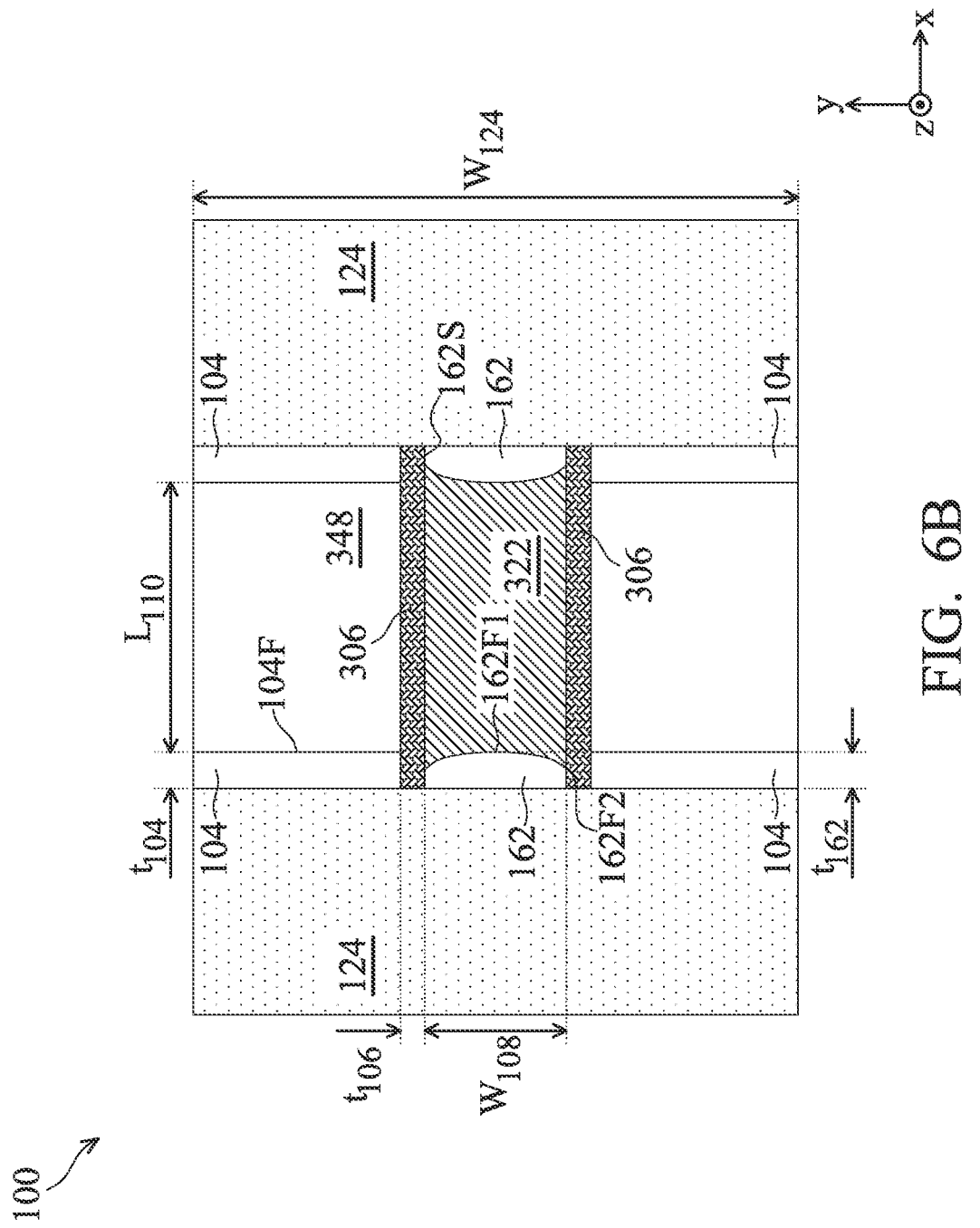

Referring to FIG. 2, in operation 215, an epitaxial region is formed in the recess structure and over the first inner spacer structure. For example, S/D region 124 (shown in FIGS. 6A and 6B) with lateral (e.g., in the y-direction) width $W_{124}$ can be formed in recess structures 436 and over first inner spacers 162 of FIGS. 5A and 5B. The process of forming S/D region 124 can include epitaxially growing S/D region 124 in the structure of FIGS. 5A and 5B using an epitaxial growth process, such as a CVD process, a LPCVD process, a RTCVD process, a MOCVD process, an ALCVD process, an UHVCVD process, a RPCVD process, an MBE process, a CDE process, and an SEG process. The epitaxial growth process can be performed using suitable precursors, such as silane ($SiH_4$), disilane ($Si_2H_6$), dichlorosilane (DCS), and germane ($GeH_4$). The epitaxial growth process can further include doping S/D region 124 using suitable dopant precursors, such as diborane ($B_2H_6$), boron trifluoride ($BF_3$), phosphine ($PH_3$), and arsine ($AsH_3$). In some embodiments, the epitaxial growth process for S/D region 124 can further include applying an etching gas, such as hydrogen chloride (HCl), to adjust S/D 124's crystalline facets. Accordingly, the resulting S/D region 124 can be grown over and in contact with channel regions 122 under polysilicon layer 348 and gate spacers 104. The resulting S/D region 124 can be further grown over and in contact with first inner spacers 162 that are vertically (e.g., in the z-direction) sandwiched by channel regions 122 and laterally (e.g., in the y-direction) sandwiched by gate spacers 104 and dielectric layers 306. In some embodiments, as shown in FIG. 6A, portions of first inner spacer 162 that is adjacent to topmost sacrificial layer 322 can be exposed after forming S/D region 124. Based on the disclosure herein, other epitaxial growth processes for forming S/D region 124 are within the spirit and scope of this disclosure.

Figure 7A:
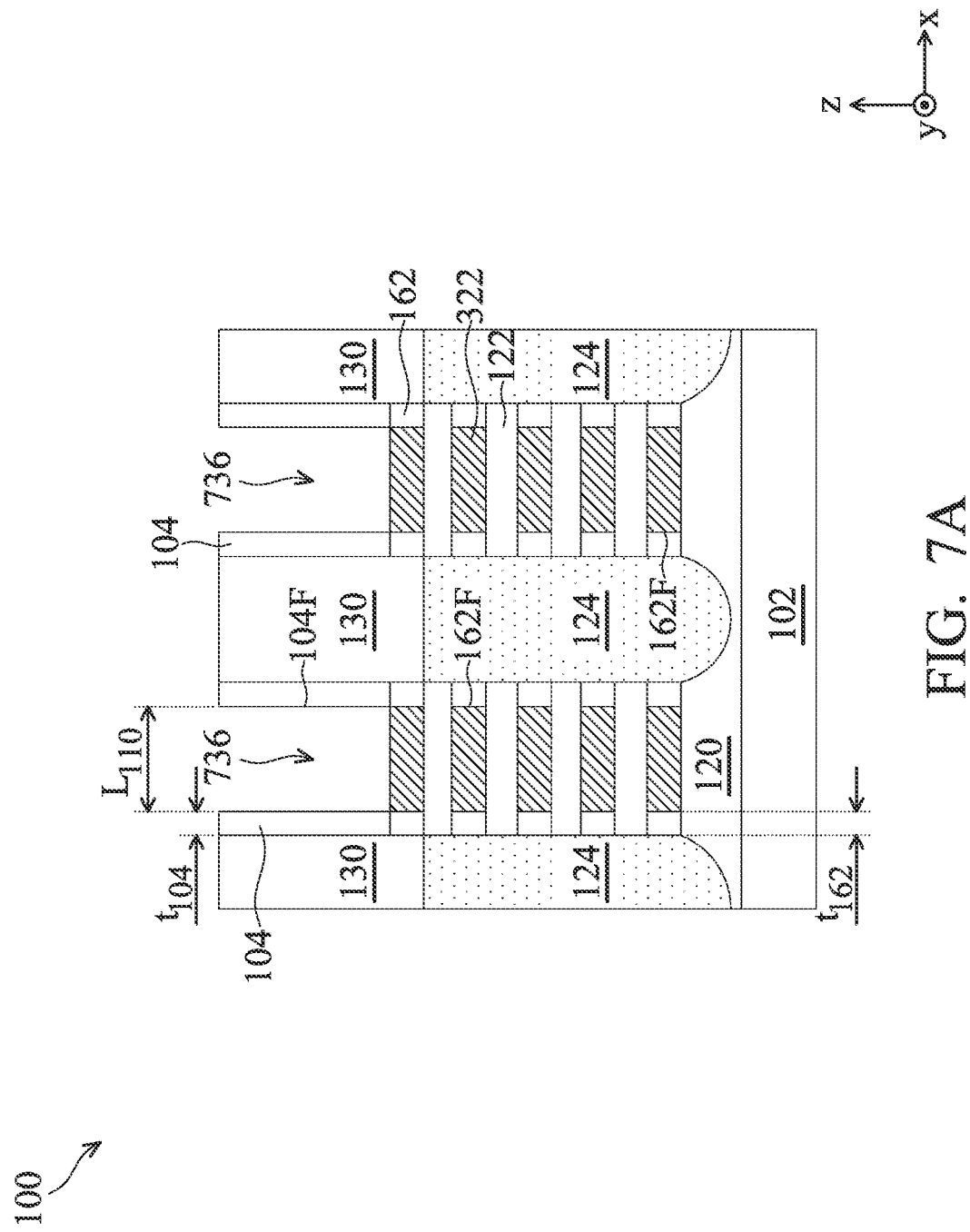
Figure 7B:
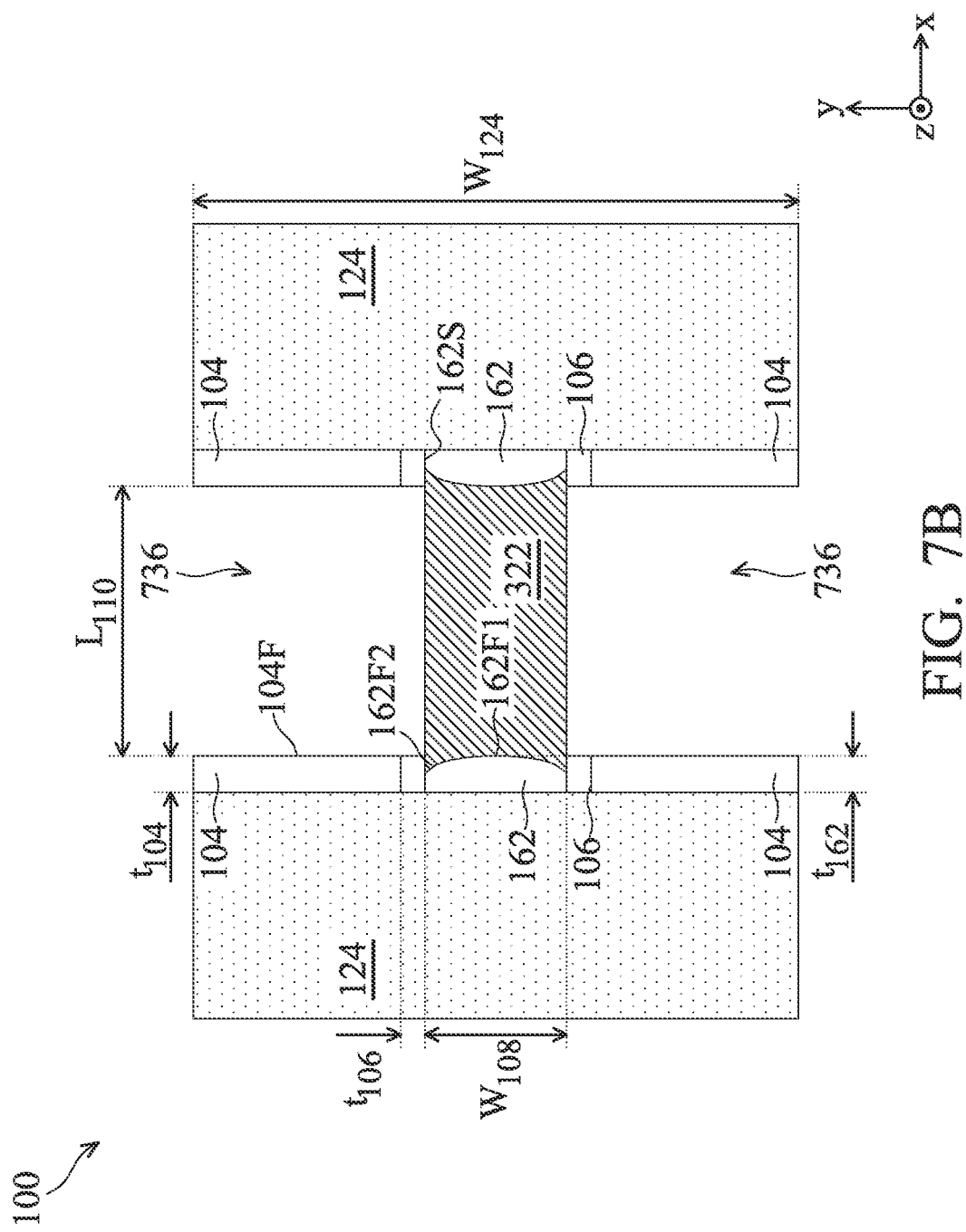

Referring to FIG. 2, in operation 220, a second inner spacer structure is formed over the epitaxial region and adjacent to the first inner spacer structure. For example, third inner spacer 106 (shown in FIG. 8B) and second inner spacer 164 (shown in FIGS. 11A and 11B) can be formed over S/D region 124 and adjacent to first inner spacer 162 with reference to FIGS. 7A-11A, 7B-11B and 12. Referring to FIGS. 7A and 7B, operation 220 can begin with forming third inner spacer 106 laterally (e.g., in the y-direction) adjacent to first inner spacer 162. The process of forming third inner spacer 106 can include (i) forming ILD layer 130 coplanarized with sacrificial gate structures 310 of FIGS. 6A and 6B using a suitable deposition process, such as a PVD process and a CVD process, and a suitable etch back process, such as a chemical mechanical polishing (CMP) process; (ii) removing hard mask layer 350 and polysilicon layer 348 to form recess structures 736 to expose dielectric layer 306 using an etching process; and (iii) removing portions of dielectric layer 306 to expose sacrificial layers 322 and define third inner spacer 106 over first inner spacer 162's side surface 162S using an etching process. In some embodiments, the etching process for forming recess structure 736 can include a dry etching process that uses chlorine, fluorine or bromine as gas etchants. In some embodiments, the etching process for forming recess structure 736 can include a wet etching process that uses an ammonium hydroxide (NH$_4$OH), sodium hydroxide (NaOH), or potassium hydroxide (KOH) as wet etchants. In some embodiments, the etching process for removing dielectric layer 306 can include a dry etching process that uses chlorine, fluorine or bromine as gas etchants. In some embodiments, the etching process for removing dielectric layer 306 can include a wet etching process that uses an hydrogen fluoride (HF) as wet etchants.

Subsequently, operation 220 can further include forming second inner spacer 164 (shown in FIGS. 11A and 11B) using an etching-deposition process with reference to FIGS. 8A-11A, 8B-11B and 12. In some embodiments, the etching-deposition process can include a radical deposition process and a radical etching process. The radical deposition process and the radical etching process can avoid channel regions 122's crystalline damages after forming second inner spacer 164, thus being essential for operation 220. In some embodiments, the radical deposition process and the radical etching process for forming second inner spacer 164 (e.g., including the process for thinning sacrificial layers 322, the process for depositing dielectric layer 964, and the process for removing dielectric layer 964; discussed below) can be performed in a same semiconductor device manufacturing apparatus (e.g., without break vacuum between the radical deposition process and the radical etching process).

Referring to FIGS. 12 and 13, a semiconductor device manufacturing apparatus 1200 can be configured to perform the radical deposition process and the radical etching process. Semiconductor device manufacturing apparatus 1200 can include a chamber 1201, a platen 1207 housed in chamber 1201 and configured to hold semiconductor device 100, and a radical generator 1211 disposed over platen 1207. Platen 1207 can be moved, via a motion mechanism (not shown in FIG. 12), in chamber 1201. For example, platen 1207 can be moved to position $Z_{near}$ that is at a distance $S_{near}$ away from radical generator 1211. Platen 1207 can also be moved to position $Z_{far}$ that is at a distance $S_{far}$, greater than distance $S_{near}$, away from radical generator 1211. Radical generator 1211 can receive a processing gas through a gas input (not shown in FIG. 12). Radical generator 1211 can further receive a radio frequency (RF) discharging power from a RF source (not shown in FIG. 12) to convert the processing gas to supply radicals 1202 propagating towards platen 1207. Semiconductor device manufacturing apparatus 1200 can perform the radical deposition process and/or the radical etching process using radicals 1202. In some embodiments, radicals 1202 can perform both the radical etching process and the radical deposition process, where the radical deposition process's deposition rate and the radical etching process's etching date can be determined based on platen 1207's position relative to radical generator 1211. For example, because radicals 1202 at position $Z_{near}$ can have a sufficient kinetic energy, the radical etching process, using radicals 1202, at position $Z_{near}$ can have an etching rate greater than a deposition rate of the radical deposition process, using radicals 1202, at position $Z_{near}$. Accordingly, as shown in FIG. 13's radical etching stage portion, platen 1207, which holds semiconductor device 100, can be moved to position $Z_{near}$ (e.g., with distance $S_{near}$ away from radical generator 1211) for a suitable time duration $t_1$, such as from about 3 seconds to about 30 seconds, to perform the radical etching process on semiconductor device 100 using the radicals that have the sufficient kinetic energy. Similarly, because radicals 1202 at position $Z_{far}$ can have a reduced kinetic energy, the radical deposition process, using radicals 1202, at position $Z_{far}$ can have a deposition rate greater than an etching rate of the radical etching process, using radicals 1202, at position $Z_{far}$. Accordingly, as shown in FIG. 13's radical deposition stage portion, platen 1207, which holds semiconductor device 100, can be moved to position $Z_{far}$ (e.g., with distance $S_{far}$ away from radical generator 1211) for a suitable time duration $t_2$, such as from about 3 seconds to about 30 seconds, to perform the radical deposition process on semiconductor device 100 using the radicals that have the reduced kinetic energy. In some embodiments, distance $S_{near}$ can be from about 5 mm to about 50 mm or from about 10 mm to about 30 mm for semiconductor device manufacturing apparatus 1200 to perform the radical etching process on semiconductor device 100 at position $Z_{near}$. If distance $S_{near}$ is below the above-noted lower limits, radicals 1202 may have excess kinetic energy to damage semiconductor device 100's structural integrity. If distance $S_{near}$ is beyond the above-noted upper limits, semiconductor device manufacturing apparatus 1200 may not perform the radical etching process, because radicals 1202 may result in another radical deposition process with a deposition rate greater than the radical etching process's etching rate. In some embodiments, distance $S_{far}$ can be from about 60 mm to about 120 mm or from about 90 mm to about 100 mm for semiconductor device manufacturing apparatus 1200 to perform the radical deposition process on semiconductor device 100 at position $Z_{far}$. If distance $S_{far}$ is below the above-noted lower limits, semiconductor device manufacturing apparatus 1200 may not perform the radical deposition process because radicals 1202 may result in another radical etching process with an etching rate greater than the radical deposition process's deposition rate. If distance $S_{near}$ is beyond the above-noted upper limits, radicals 1202 may be susceptible to insufficient kinetic energy to initiate the radical deposition process on semiconductor device 100. In some embodiments, a ratio of distance $S_{far}$ to distance $S_{near}$ can be from about 2.0 to about 12.0 or from about 3.0 to about 10.0 to enable semiconductor device manufacturing apparatus 1200 to perform the radical etching process on semiconductor device 100 at position $Z_{near}$ and the radical deposition process on semiconductor device 100 at position $Z_{far}$. If the ratio of distance $S_{far}$ to distance $S_{near}$ is below the above-noted lower limits, radicals 1202's kinetic energy may be substantially unchanged between positions $S_{far}$ and $S_{near}$, thus being unable to provide both radical deposition process and radical etching process in semiconductor manufacturing apparatus 1200. If the ratio of distance $S_{far}$ to distance $S_{near}$ is below the above-noted lower limits, radicals 1202 may be susceptible to insufficient kinetic energy to initiate the radical deposition process on semiconductor device 100. In some embodiments, during the time duration $t_1$ of FIG. 13, platen 1207's position can be vertically (e.g., in the z-direction) adjusted from position $Z_{near}$ to another position proximate to $Z_{near}$ (e.g., within position $Z_{near}$ by about 30% of separation $S_{near}$) to perform the radical etching process. In some embodiments, during the time duration $t_2$ of FIG. 13, platen 1207's position can be vertically (e,g., in the z-direction) adjusted from position $Z_{far}$ to another position proximate to $Z_{far}$ (e.g., within position $Z_{far}$ by about 30% of separation $S_{far}$) to perform the radical deposition process. In some embodiments, the processing gases, received by radical generator 1211, for the radical etching process (e.g., during the time duration $t_1$ of FIG. 13) and the radical deposition process (e.g., during the time duration $t_2$ of FIG. 13) can be made of different gas species. In some embodiments, the processing gases, received by radical generator 1211, for the radical etching process (e.g., during the time duration $t_1$ of FIG. 13) and the radical deposition process (e.g., during the time duration $t_2$ of FIG. 13) can be made of identical gas species. In some embodiments, radical generator 1211 can receive the processing gases to generate radicals 1202 while platen 1207 is moving between position $Z_{near}$ and position $Z_{far}$ (e.g., switching between the radical deposition process and the radical etching process).

Figure 8A:
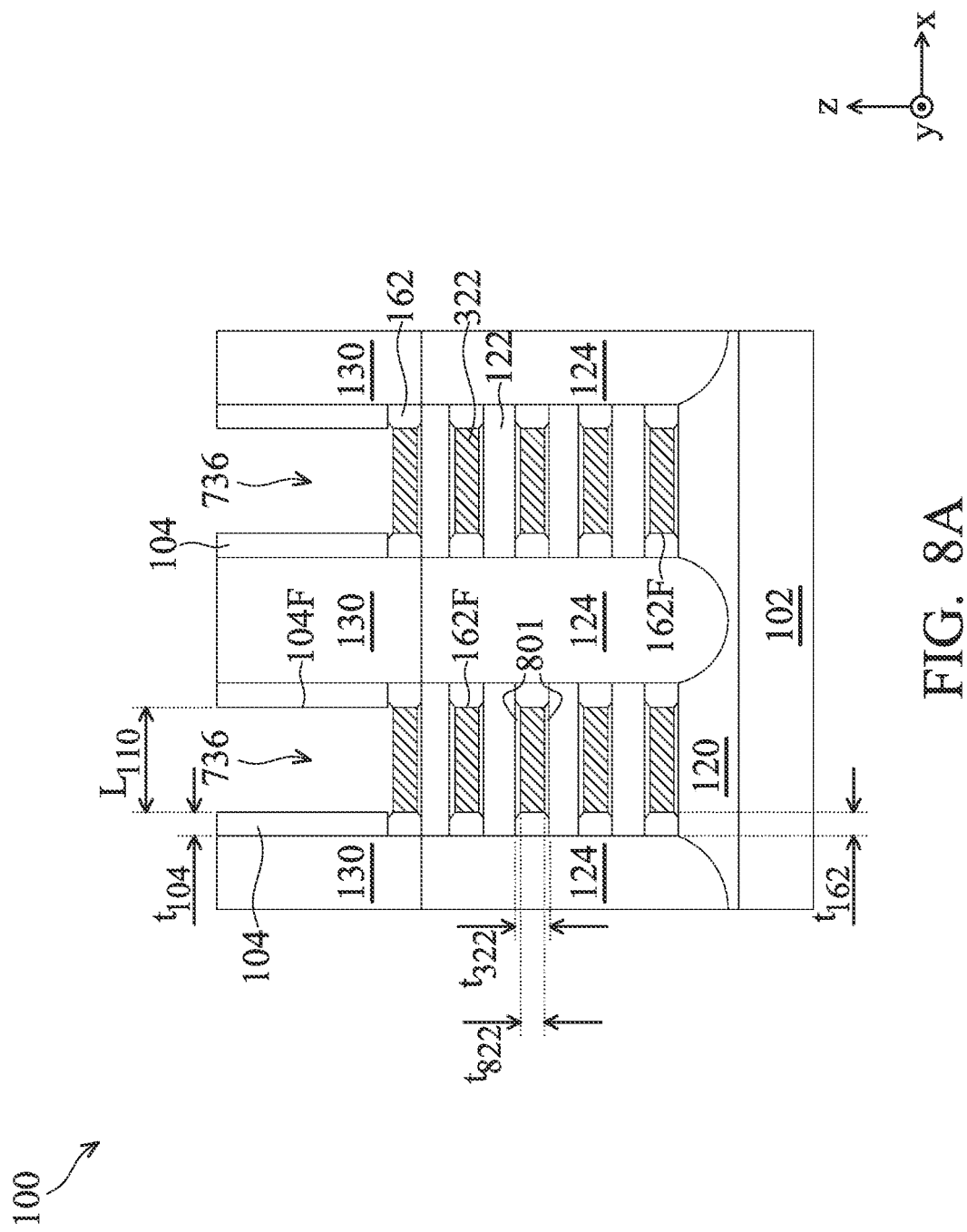
Figure 8B:
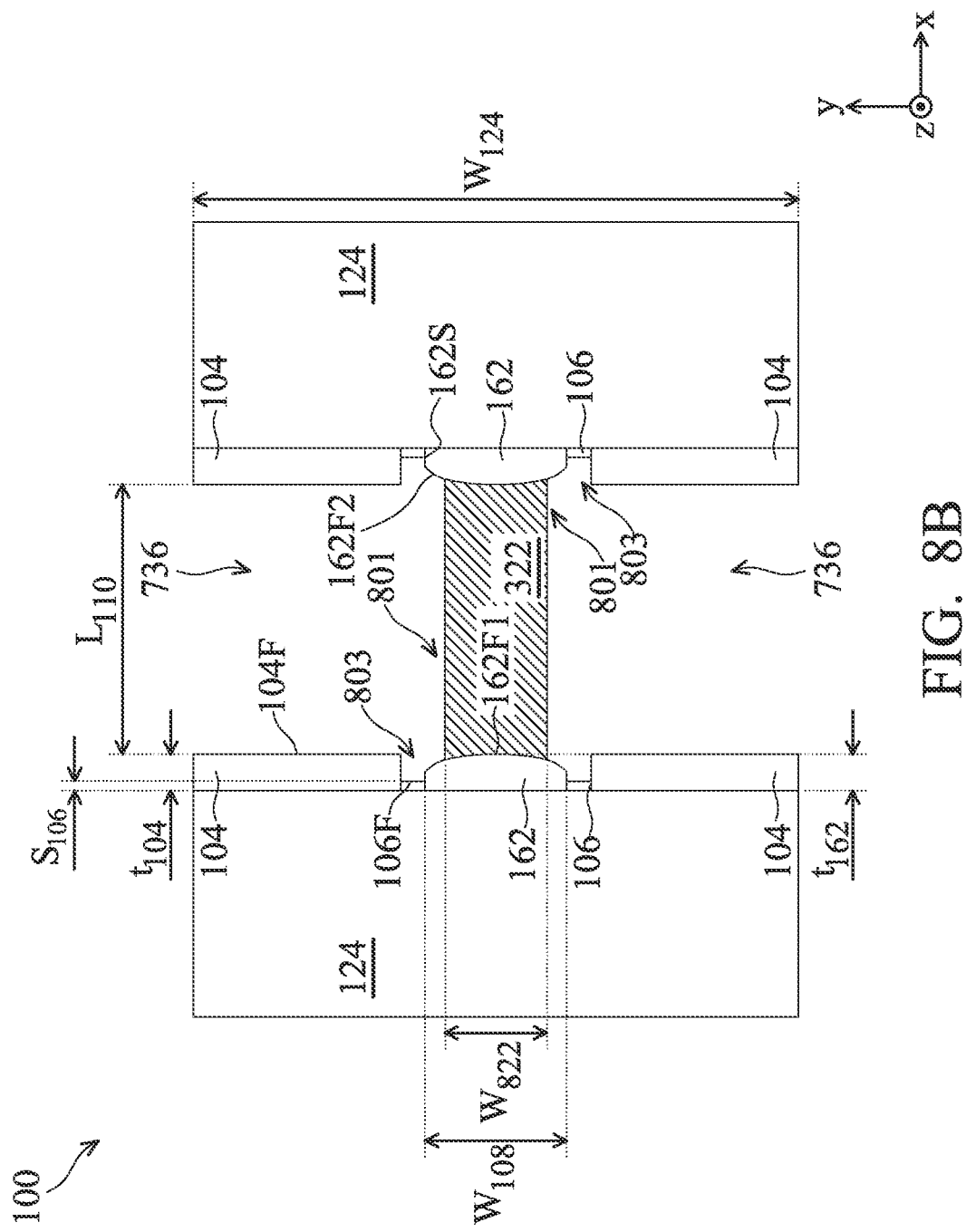

Referring to FIGS. 8A and 8B, the process of forming second inner spacer 164 can include thinning sacrificial layer 322 of FIGS. 7A and 7B. In some embodiments, the process of thinning sacrificial layer 322 can be a plasma etching process. In some embodiments, the process of thinning sacrificial layer 322 can be the radical etching process. For example, semiconductor device 100 of FIGS. 7A and 7B can be placed on platen 1207 (shown in FIG. 12), and platen 1207 can be subsequently moved to position $Z_{near}$ (shown in FIG. 12) to perform the radical etching process for time duration $t_1$ (shown in FIG. 13) at or proximate to position $Z_{near}$. The processing gas associated with the radical etching process for thinning sacrificial layer 322 can include a fluorine-based gas, such as nitrogen trifluoride ($NF_3$) and carbon tetrafluoride ($CF_4$). In some embodiments, the processing gas associated with the radical etching process can include a chlorine-based gas or a bromine-based gas. Accordingly, as shown in FIG. 8A, sacrificial layer 322 can be reduced from thickness $t_{322}$ (e.g., about 10 nm) to a thickness $t_{822}$ (e.g., about 5 nm), less than thickness $t_{322}$, to form recess structures 801, vertically (e.g., in the z-direction) adjacent to sacrificial layer 322, to expose vertically (e.g., in the z-direction) adjacent channel regions 122. Further, as shown in FIG. 8B, sacrificial layer 322 can be reduced from width $W_{108}$ (e.g., about 20 nm) to a width $W_{822}$ (e.g., about 10 nm), less than width $W_{108}$, to form recess structures 801, laterally (e.g., in the y-direction; shown in FIG. 8B) adjacent to sacrificial layer 322, to expose first inner spacer 162's side surfaces 162S and first inner spacer 162's second portion 162F2. In some embodiments, the radical etching process can further remove portions of third inner spacer 106 to form recess structure 803. Accordingly, recess structure 803 can protrude into third inner spacer 106 to define third inner spacer 106's front surface 106F that separates from S/D region 124 with a separation $S_{106}$. In some embodiments, separation $S_{106}$ can represent the horizontal (e.g., in the x-direction) dimension of FIG. 1C's third inner spacer 106 after method 200. In some embodiments, because the radical etching process can have a reduced RF power compared to plasma processes (e.g., a reactive ion etching process), recess structure 803 does not extend through third inner spacer 106. Accordingly, separation $S_{106}$ can be greater than zero, such as from greater than about 1 nm and greater about 2 nm, to allow third inner spacer 106 to protect separate S/D region 124 from the radical etching process during the process of forming recess structures 801 and/or 803. If separation $S_{106}$ is below is the above-noted lower limits, the straggle of the radical etching process for forming recess structures 801 and/or 803 may penetrate through third inner spacer 106 to damage S/D region 124's structural integrity. In some embodiments, separation $S_{106}$ can be greater than zero and less than gate spacer 104's thickness $t_{104}$.

Figure 9A:
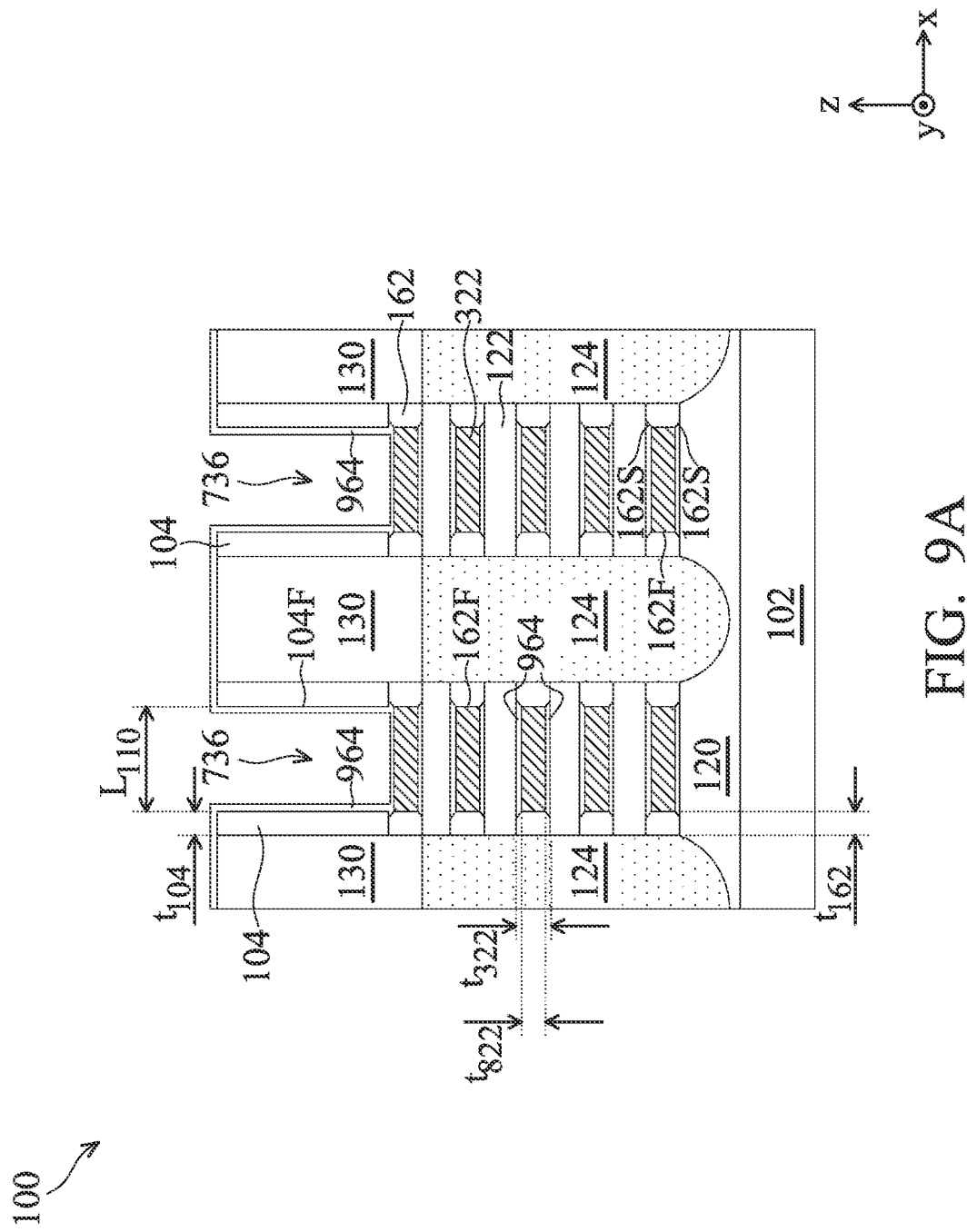
Figure 9B:
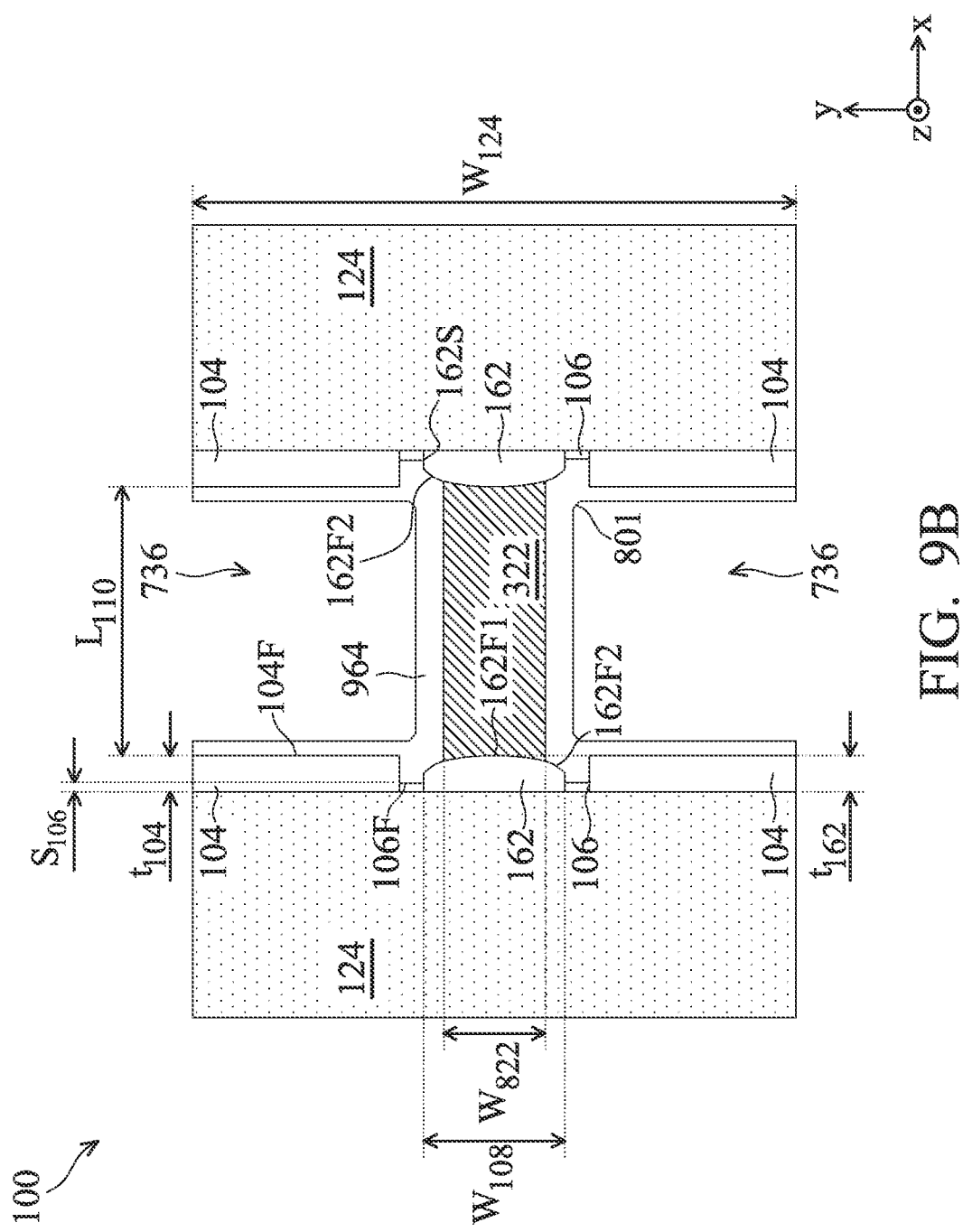

Referring to FIGS. 9A and 9B, the process of forming second inner spacer 164 can further include depositing a dielectric layer 964 over the structure of FIGS. 8A and 8B using the radical deposition process. For example, semiconductor device 100 of FIGS. 8A and 8B can be placed on platen 1207 (shown in FIG. 12), and platen 1207 can be moved away from radical generator 1211 (shown in FIG. 12), such as moving from position $Z_{near}$ to position $Z_{far}$ (shown in FIG. 12), to perform the radical deposition process for time duration $t_2$ (shown in FIG. 13) at or proximate to position $Z_{far}$. In some embodiments, the process of thinning sacrificial layers 322 and the process of depositing dielectric layer 964 can be perform in semiconductor device manufacturing apparatus 1200 by moving platen 1207 towards and away from, respectively, radical generator 1211 without breaking chamber 1201's vacuum. The processing gas associated with the radical deposition process for depositing a dielectric layer 964 can include oxygen, a fluorine-based gas (e.g., $CF_4$ or $NF_3$), a silicon-based gas, such as $SiH_4$, or a chlorine-based gas, such as silicon tetrachloride ($SiCl_4$). Accordingly, dielectric layer 964 can be made of a same material as second inner spacer 164 to fill recess structure 801 to cover channel regions 122 and sacrificial layers 322. For example, dielectric layer 964 can be made of a dielectric material that can include carbon, chlorine, and/or fluorine. Further, dielectric layer 964 can fill recess structure 803 to cover third inner spacer 106, first inner spacer 162's side surface 162S, and first inner spacer 162's second portion 162F2. In some embodiments, the processing gas associated with the radical deposition process for depositing dielectric layer 964 can be different from another processing gas associated with the radical etching process for thinning sacrificial layer 322. In some embodiments, the processing gas associated with the radical deposition process for depositing dielectric layer 964 can be the same as another processing gas associated with the radical etching process for thinning sacrificial layer 322.

Figure 10A:
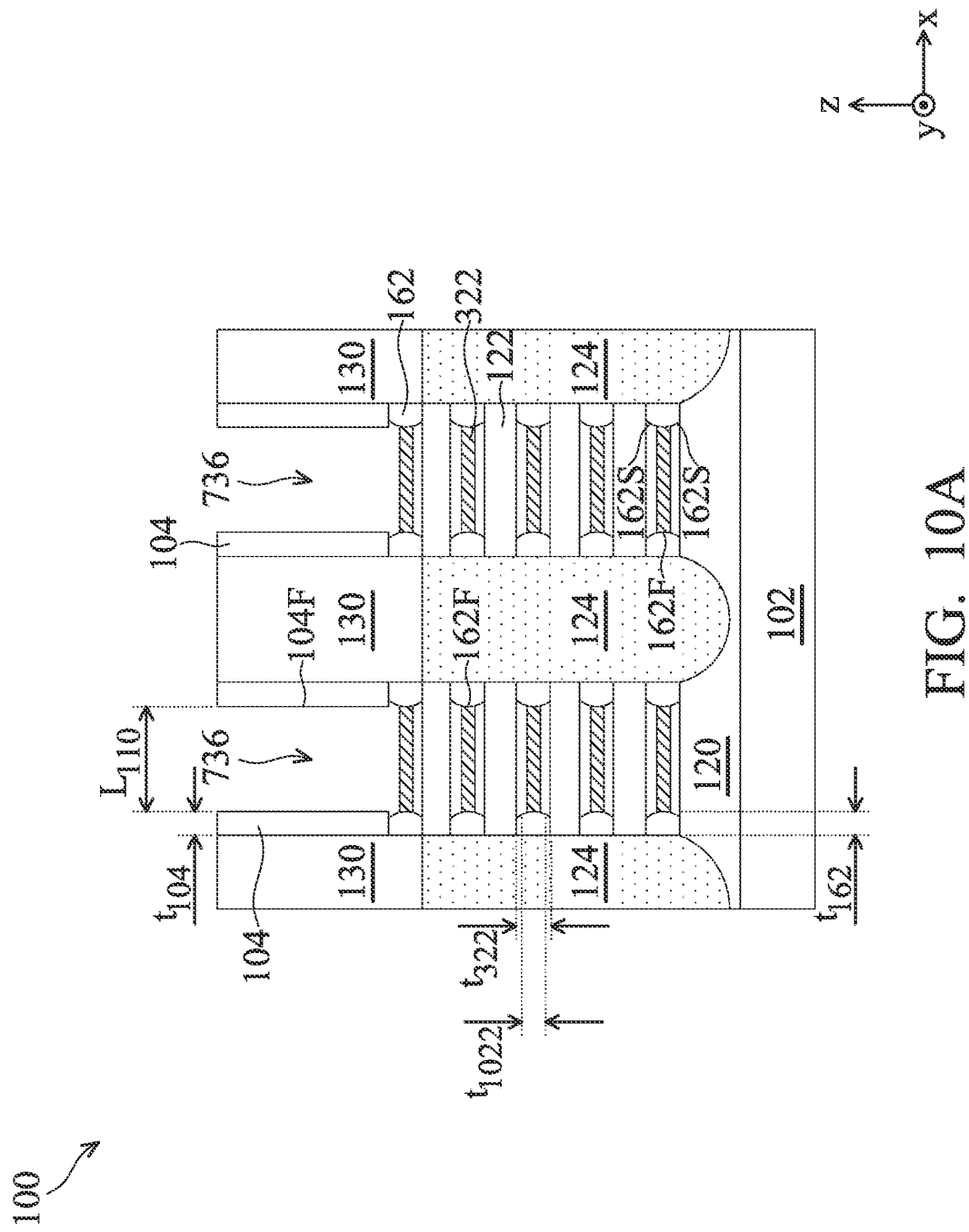
Figure 10B:
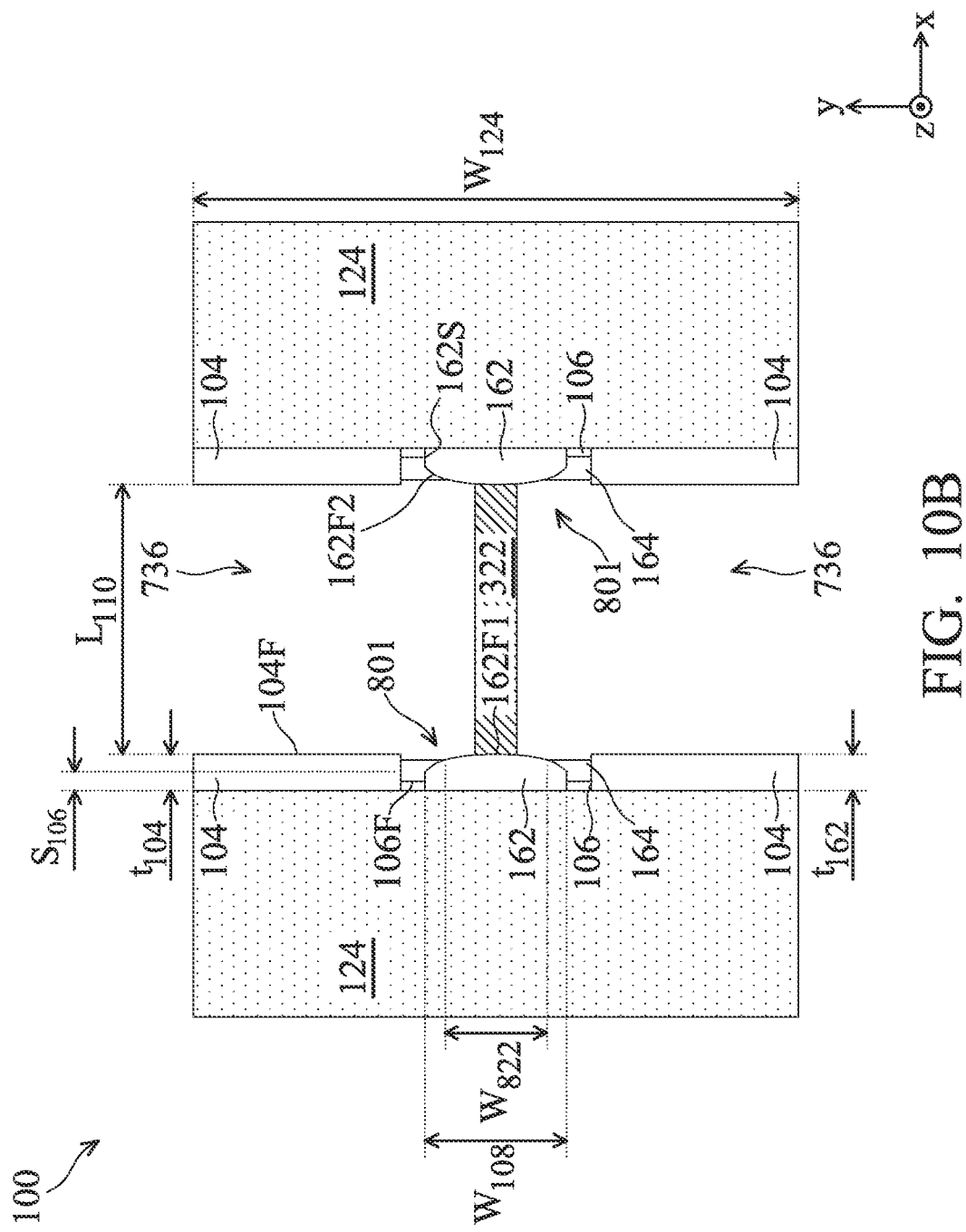
Figure 11A:
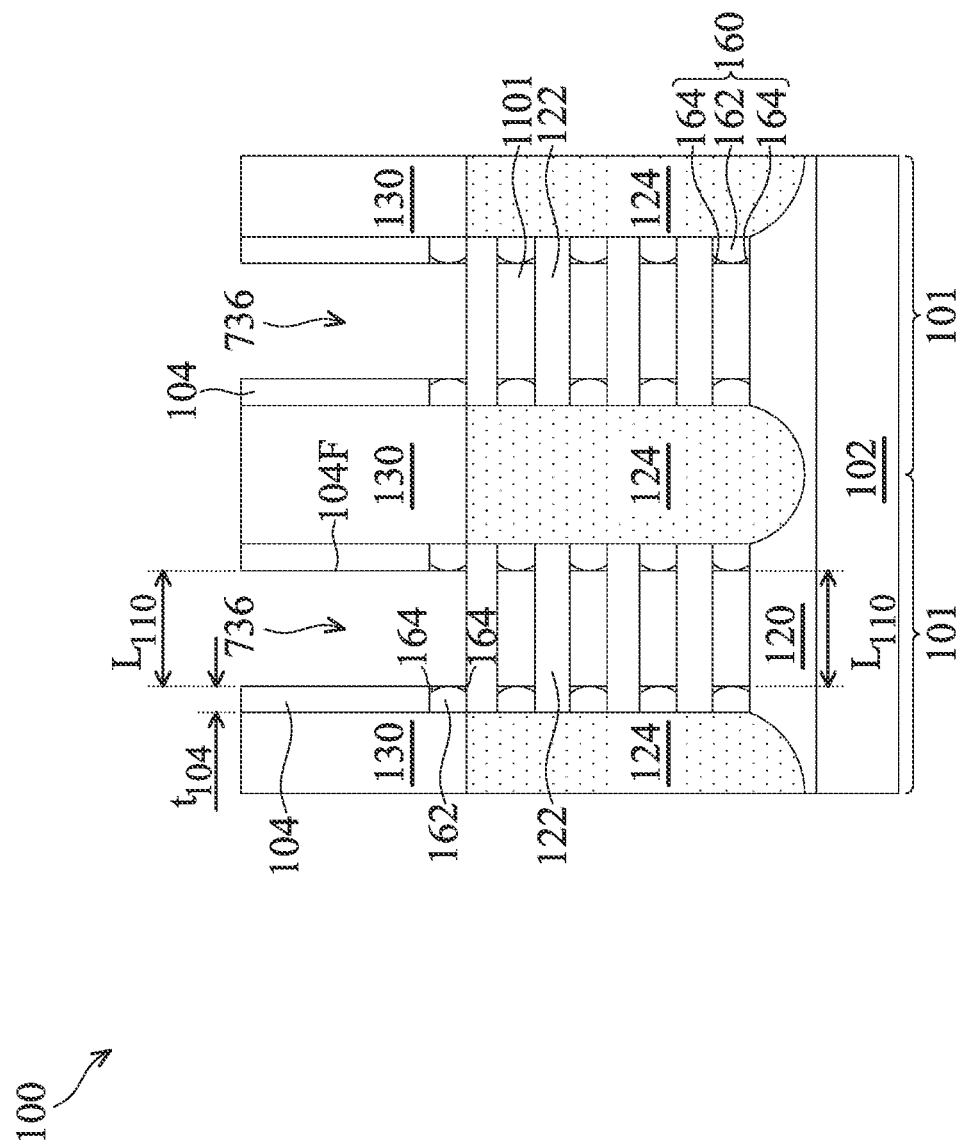
Figure 11B:
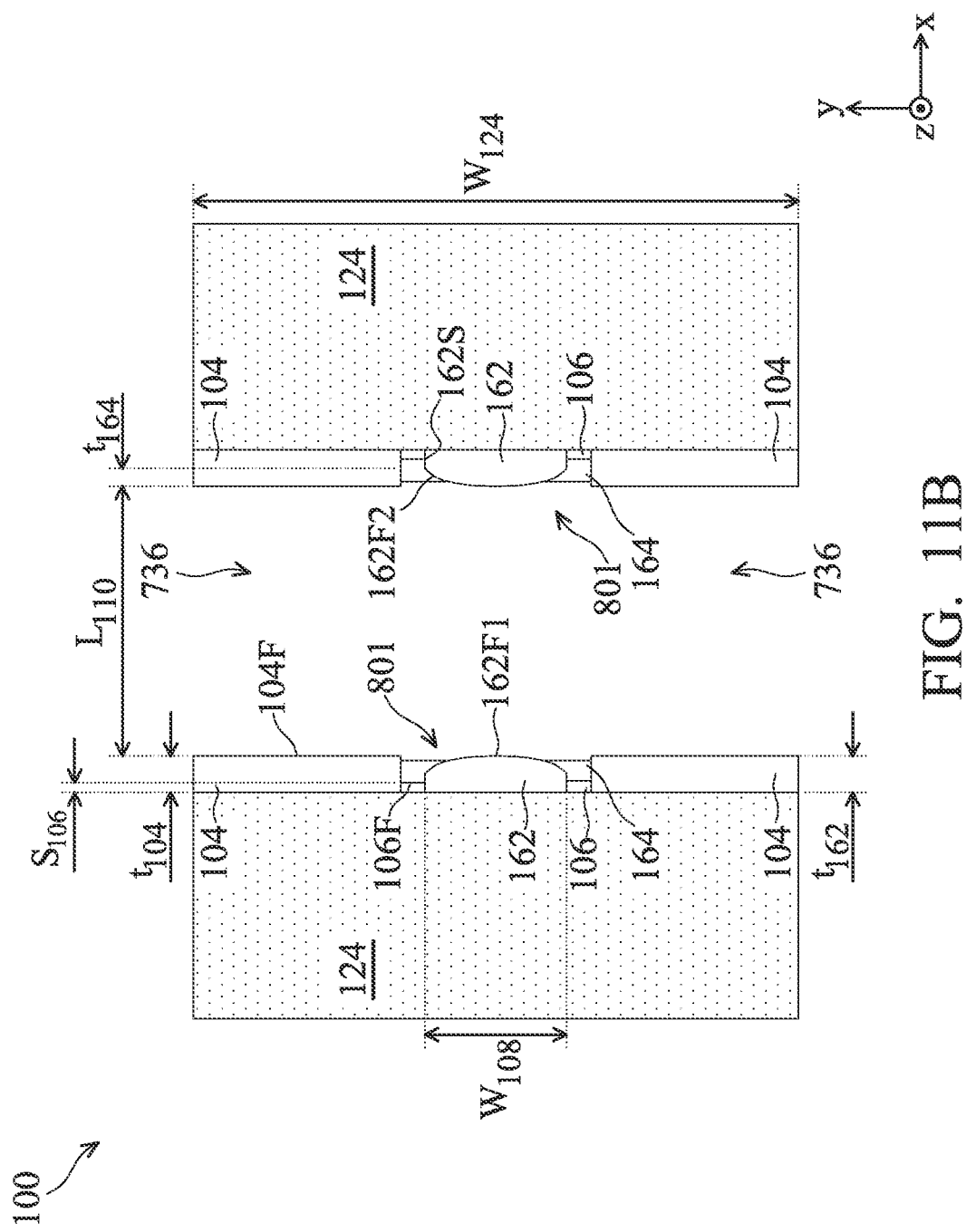

Referring to FIGS. 10A and 10B, the process of forming second inner spacer 164 can include removing dielectric layer 964 to expose gate spacers 104 and channel regions 122 using the radical etching process, For example, semiconductor device 100 of FIGS. 9A and 9B can be placed on platen 1207 (shown in FIG. 12), and platen 1207 can be moved towards radical generator 1211 (shown in FIG. 12), such as moving from position $Z_{far}$ to position $Z_{near}$ (shown in FIG. 12), to perform the radical etching process for time duration $t_1$ (shown in FIG. 13) at or proximate to position $Z_{near}$. Because the radical etching process for removing dielectric layer 964 can have a reduced RF power compared to plasma processes (e.g., a reactive ion etching process), crystalline damage of the exposed channel region 122 can be avoided after forming second inner spacers 164. In some embodiments, the processing gas associated with the radical etching process for removing dielectric layer 964 can include a fluorine-based gas, such as $NF_3$ and $CF_4$. In some embodiments, the processing gas associated with the radical etching process can include a chlorine -based gas or a bromine-based gas. In some embodiments, the processing gas associated with the radical etching process for removing dielectric layer 964 can be the same as another processing gas associated with the radical etching process for thinning sacrificial layer 322. The radical etching process for removing dielectric layer 964 can etch a first portion of dielectric layer 964 to expose gate spacers 104, while a second portion of dielectric layer 964 can remain filled in recess structure 803 (shown in FIG. 9B), after the radical etching process. Such second portion of dielectric layer 964 filled in recess structure 803 can therefore define second inner spacer 164 (shown in FIG. 10B) to protect third inner spacer 106 and S/D region 124 from structural damages introduced by the radical etching process.

Further, the: radical etching process for removing dielectric layer 964 can thin sacrificial layers 322 (e.g., thinning sacrificial layer 322 from thickness $t_{822}$ (e.g., about 5 nm) to a thickness $t_{1022}$ (e.g., about 3 nm) less than thickness $t_{822}$; thinning sacrificial layer 322 from width $W_{822}$ (e.g., about 10 nm) to a width $W_{1022}$ (e.g., about 5 nm) less than width $W_{822}$). In some embodiments, with sacrificial layers 322 remaining (e.g., thickness $t_{1022}$ and width $W_{1022}$ greater than zero) after removing dielectric layer 964, the process of forming second inner spacer 164 can loop back to (i) deposit another dielectric layer 964 using the radical deposition process (e.g., discussed previously at FIGS. 9A and 9B) and (ii) remove the other dielectric layer 964 using the radical deposition process (e.g., discussed previously at FIGS. 10A and 10B) to further thin sacrificial layers 322. In some embodiments, referring to FIGS. 11A and 11B, the radical etching process for removing dielectric layer 964 can completely remove sacrificial layers 322 to form recess structures 1101 connecting two vertically (e.g., in the z-direction) adjacent channel regions 122. Accordingly, the resulting second inner spacer 164 with a horizontal (e.g., in the x-direction) thickness $t_{164}$ can be formed over first inner spacer 162's side surfaces 162S and second portion 162F2, and first inner spacer 162's first portion 162F1, previously connecting with sacrificial layer 322, can be exposed to recess structure 1101. In some embodiments, thickness $t_{164}$ can represent the horizontal (e.g. in the x-direction) dimension of FIG. 1C's second inner spacer 164 after method 200. Thickness $t_{164}$ can be from about 2 nm to about 5 nm or from about 2 nm to about 3 nm. If thickness $t_{164}$ is below the above-noted lower limits, second inner spacer 164 may not be able to protect third inner spacer 106's structural integrity from the radical etching process's straggle during the process of removing dielectric layer 964. If thickness $t_{164}$ is beyond the above-noted upper limits, second inner spacer 164 may reduce the contact area between channel region 122 and gate structure 110 (formed at operation 225; discussed below), thus degrading gate structure 110's gate modulation to reconcile FET 101's short channel effect. In some embodiments, a ratio of thickness $t_{162}$ to thickness $t_{164}$ can be from about 0.2 to about 0.8, from about 0.4 to about 0.8, or from about 0.4 to about 0.6. If the ratio of thickness $t_{162}$ to thickness $t_{164}$ is below the above-noted lower limits, second inner spacer 164 may reduce the contact area between channel region 122 and gate structure 110 (formed at operation 225; discussed below), thus degrading gate structure 110's gate modulation to reconcile FET 101's short channel effect. If the ratio of thickness $t_{162}$ to thickness $t_{164}$ is beyond the above-noted upper limits, second inner spacer 164 may not be able to protect third inner spacer 106's structural integrity from the radical etching process's straggle during the process of removing dielectric layer 964. In some embodiments, thickness $t_{164}$ can be substantially equal to the difference between separation $S_{106}$ and thickness $t_{104}$ (e.g., front surfaces 104F and 164F can be substantially coplanar with each other). In some embodiments, the sum of thickness $t_{164}$ and separation $S_{106}$ can be substantially equal to thickness $t_{162}$.

Referring to FIG. 2, in operation 225, a metal gate structure is formed over the fin structure. For example, gate structure 110 (shown in FIGS. 1A and 1B) can be formed over fin structure 108. The process of forming gate structure 110 can include filling gate dielectric layer 112 and a gate electrode 114 in the recess structures 1101 of FIGS. 11A and 11B using a suitable deposition process, such as an ALD process and a CVD process, and a suitable etch back process, such as a CMP process. Based on the disclosure herein, other processes for forming gate structure 110 are within the spirit and scope of this disclosure.

The present disclosure provides an exemplary transistor inner spacer structure and a method for forming the same. The inner spacer structure can have a multilayered structure to improve its structural integrity to protect the transistor's S/D structure. The inner spacer structure can have a first dielectric layer connecting to the transistor's S/D structure and the transistor's gate structure. The inner spacer structure can further have second and third dielectric layers formed over first dielectric layer's side surfaces. The second dielectric layer can be proximate to the transistor's S/D structure, and the third dielectric layer can be proximate to the transistor's gate structure. The method of forming the inner spacer structure can include performing an etching-deposition process in a semiconductor device manufacturing apparatus. The etching-deposition process can include a radical deposition process to deposit the third dielectric layer. The etching-depositing process can further include a radical etching process to remove the sacrificial semiconductor layers to define the transistor's channel. The radical etching process and the radical deposition process can be performed in the same semiconductor device manufacturing apparatus without breaking the vacuum of in the semiconductor device manufacturing apparatus. A benefit of the present disclosure, among others, is to provide the inner structure with robust structural integrity and the in-situ etching-deposition process for forming the same, thus improving the IC's reliability and throughput.

In some embodiments, a semiconductor structure can include a substrate, a fin structure over the substrate, a gate structure over the fin structure, a first inner spacer layer formed in the fin structure and adjacent to the gate structure, and a second inner spacer layer extending through the first inner spacer layer.

In some embodiments, a semiconductor structure can include a substrate, a fin structure over the substrate, a gate structure formed in the fin structure, a source/drain (S/D) region formed in the fin structure and separated from the gate structure, a first inner spacer layer formed in the fin structure and adjacent to the gate structure, and a second inner spacer layer extending from the gate structure to the S/D region. The first inner spacer layer can be over a side surface of the second inner spacer layer.

In some embodiments, a method can include forming a fin structure over a substrate, forming a first recess structure in the fin structure to expose a side surface of the fin structure, forming a first inner spacer layer protruding into the side surface of the fin structure, forming a second recess structure in the fin structure to expose an other side surface of the first inner spacer layer, and forming a second inner spacer layer over the other side surface.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method, comprising:
   forming a fin structure over a substrate, wherein the fin structure comprises a nanostructure;

forming a first inner spacer at an end portion of the nanostructure;

positioning the substrate at a first distance from a radical source to remove a portion of the nanostructure; and positioning the substrate at a second distance, greater than the first distance, from the radical source to form a second inner spacer in contact with a front surface of the first inner spacer.

2. The method of claim 1, further comprising forming a third inner spacer in contact with the first and second inner spacers.

3. The method of claim 1, wherein positioning the substrate at the first distance from the radical source comprises positioning the substrate at the first distance between about 5 nm and about 50 nm from the radical source.

4. The method of claim 1, wherein positioning the substrate at the second distance from the radical source comprises positioning the substrate at the second distance between about 60 nm and about 120 nm from the radical source.

5. The method of claim 1, wherein positioning the substrate at the first distance from the radical source comprises performing an etching process using radicals generated by the radical source.

6. The method of claim 1, wherein positioning the substrate at the first distance from the radical source comprises performing an etching process on the nanostructure at an etching rate greater than a deposition rate of the second inner spacer.

7. The method of claim 1, wherein positioning the substrate at the second distance from the radical source comprises performing a deposition process using radicals generated by the radical source.

8. The method of claim 1, wherein positioning the substrate at the second distance from the radical source comprises performing a deposition process to form the second inner spacer at a deposition rate greater than an etching rate of the second inner spacer.

9. The method of claim 1, wherein positioning the substrate at the first distance from the radical source to remove the portion of the nanostructure comprises forming an opening in the removed portion of the nanostructure, and wherein positioning the substrate at the second distance from the radical source to form the second inner spacer comprises:

depositing a second inner spacer layer in the opening; and removing a portion of the second inner spacer layer.

10. The method of claim 1, further comprising:

positioning the substrate at a third distance from the radical source;

removing the nanostructure using radicals generated by the radical source to form an opening; and forming a gate structure in the opening and in contact with the first and second inner spacers.

11. A method, comprising:

removing a portion of a fin structure to form a source/drain (S/D) opening, wherein the fin structure is formed over a substrate and comprises a nanostructure;

forming, via the S/D opening, a first inner spacer at an end portion of the nanostructure;

forming a S/D region in the S/D opening;

positioning the substrate at a first distance from a radical source to remove a portion of the nanostructure; and positioning the substrate at a second distance, greater than the first distance, from the radical source to form, via the removed portion of the nanostructure, a second inner spacer in contact with a front surface of the first inner spacer.

12. The method of claim 11, further comprising forming, via the removed portion of the nanostructure, a third inner spacer in contact with a side surface of the first inner spacer and in contact with the second inner spacer.

13. The method of claim 11, wherein positioning the substrate at the first distance from the radical source comprises performing an etching process on the nanostructure at an etching rate greater than a deposition rate of the second inner spacer.

14. The method of claim 11, wherein positioning the substrate at the second distance from the radical source comprises performing a deposition process to form the second inner spacer at a deposition rate greater than an etching rate of the second inner spacer.

15. The method of claim 11, wherein forming the second inner spacer comprises:

depositing a second inner spacer layer in the removed portion of the nanostructure; and removing a portion of the second inner spacer layer.

16. The method of claim 11, further comprising:

positioning the substrate at a third distance from the radical source;

removing the nanostructure using radicals generated by the radical source to form an opening; and forming a gate structure in the opening and in contact with the first and second inner spacers.

17. An apparatus, comprising:

a radical generator configured to:

receive a processing gas from a gas input;

receive a radio frequency (RF) discharging power from an RF source; and convert the processing gas to radicals; and a substrate holder configured to:

position a substrate at a first distance from the radical generator to remove a portion of a nanostructure: to expose a front surface of a first inner spacer, wherein the substrate comprises a fin structure comprising the nanostructure, and wherein the first inner spacer is formed at an end portion of the nanostructure; and position the substrate at a second distance, greater than the first distance, from the radical generator to form a second inner spacer in contact with the front surface of the first inner spacer.

18. The apparatus of claim 17, wherein the substrate holder is configured to position the substrate at the first distance between about 5 nm and about 50 nm from the radical generator, and wherein the substrate holder is configured to position the substrate at the second distance between about 60 nm and about 120 nm from the radical generator.

19. The apparatus of claim 17, wherein in response to the substrate being positioned at the first distance from the radical generator, the apparatus is configured to perform an etching process using the radicals.

20. The apparatus of claim 17, wherein in response to the substrate being positioned at the second distance from the radical generator, the apparatus is configured to perform a deposition process using the radicals.

* * * * *